United States Patent
Saka et al.

(10) Patent No.: US 7,745,877 B2
(45) Date of Patent: Jun. 29, 2010

(54) SEMICONDUCTOR DEVICE AND MANUFACTURING METHOD THEREOF

(75) Inventors: Kikuo Saka, Hyogo (JP); Kimihiko Yamashita, Hyogo (JP); Toshiyuki Takemori, Saitama (JP); Yuji Watanabe, Saitama (JP)

(73) Assignee: Ricoh Company, Ltd., Tokyo (JP)

( * ) Notice: Subject to any disclaimer, the term of this patent is extended or adjusted under 35 U.S.C. 154(b) by 224 days.

(21) Appl. No.: 11/901,172

(22) Filed: Sep. 13, 2007

(65) Prior Publication Data

US 2009/0114982 A1    May 7, 2009

(30) Foreign Application Priority Data

Sep. 15, 2006  (JP) .............................. 2006-251621
Nov. 27, 2006  (JP) .............................. 2006-318931

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ................. 257/330; 257/341; 257/E27.091
(58) Field of Classification Search ................. 257/302, 257/330, 331, 332, 341, 401, E27.091, E29.13
See application file for complete search history.

(56) References Cited

U.S. PATENT DOCUMENTS

| 4,767,722 | A    | 8/1988 | Blanchard |
| 7,166,891 | B2 * | 1/2007 | Yoshimochi ................. 257/329 |
| 2005/0082607 | A1 * | 4/2005 | Nakamura et al. .......... 257/330 |

FOREIGN PATENT DOCUMENTS

| JP | 2662217    | 6/1997 |
| JP | 2001-85685 | 3/2001 |
| JP | 2002-26324 | 1/2002 |
| JP | 2002-184784 | 6/2002 |

* cited by examiner

*Primary Examiner*—Hoai v Pham
(74) *Attorney, Agent, or Firm*—Cooper & Dunham LLP

(57) ABSTRACT

A disclosed semiconductor device provided with a power MOSFET includes: a semiconductor substrate constituting a drain; a trench formed on a surface of the semiconductor substrate; a gate electrode in the trench; a body diffusion layer on a surface side of the semiconductor substrate, the body diffusion layer being positioned adjacently to the trench and formed shallower than the trench; a source diffusion layer on the surface of the semiconductor substrate; a first interlayer insulating film formed on the gate electrode; and a source electrode film made of a metallic material and formed on the semiconductor substrate. A top surface of the gate electrode and a top surface of the first interlayer insulating film are formed in a recessed manner in the trench relative to the surface of the semiconductor substrate, and a surface portion of the semiconductor substrate for the trench is formed into a tapered shape.

7 Claims, 19 Drawing Sheets

SEMICONDUCTOR DEVICE AND MANUFACTURING METHOD THEREOF

BACKGROUND OF THE INVENTION

1. Technical Field

This disclosure generally relates to a semiconductor device and a manufacturing method thereof and more particularly to a semiconductor device and a manufacturing method thereof in which the semiconductor device is provided with a power MOSFET including a semiconductor substrate constituting a drain, a trench formed on a surface of the semiconductor substrate, a gate electrode in the trench, the gate electrode being made of polysilicon and formed via a gate insulating film, a body diffusion layer on a surface side of the semiconductor substrate, the body diffusion layer being positioned adjacently to the trench and formed shallower than the trench, a source diffusion layer on the surface of the semiconductor substrate, the source diffusion layer being positioned adjacently to the trench and the body diffusion layer and formed shallower than the body diffusion layer, a first interlayer insulating film formed on the gate electrode, and a source electrode film made of a metallic material and formed on the semiconductor substrate, the source electrode film being insulated from the gate electrode and electrically connected to the body diffusion layer and the source diffusion layer.

2. Description of the Related Art

Power MOSFETs are used in the field of power electronics involving high current and high voltage. In recent years, there have been increasing demands for low Ron as power management of batteries for mobile communication devices and trench-gate type power MOSFETs have attracted attention.

FIG. 1 is a cross-sectional view showing a cell portion of a conventional power MOSFET.

An N-type epitaxial layer (N−) 3 formed by epitaxial growth is formed on a surface of an N-type single-crystal silicone substrate (N+) 1. The N-type single-crystal silicone substrate 1 and the N-type epitaxial layer 3 constitute a drain. A gate insulating film 7 is formed on an inner wall of a trench 5 formed on a surface of the N-type epitaxial layer 3. A gate electrode 9 made of polysilicon is formed in the trench 5 via the gate insulating film 7.

A P-type body diffusion layer (P−) 11 is formed adjacently to the trench 5 on a surface side of the N-type epitaxial layer 3. An N-type source diffusion layer 13 is formed adjacently to the trench 5 on a surface side of the P-type body diffusion layer 11. A P-type contact diffusion layer (P+) 15 is formed on a surface of the N-type epitaxial layer 3 with a certain distance from the trench 5 and such a depth as to reach the P-type body diffusion layer 11.

A first interlayer insulating film 18 made of a silicon oxide film, for example, is formed on the gate electrode 9. The first interlayer insulating film 18 is formed in a protrusion manner relative to the surface of the N-type epitaxial layer 3 and covers a portion of the N-type source diffusion layer 13 adjacent to the trench 5. A source electrode film 19 is formed on the N-type source diffusion layer 13, the P-type contact diffusion layer 15, and the first interlayer insulating film 18.

Such a power MOSFET is disclosed in Patent Document 1, for example.

In the power MOSFET shown in FIG. 1, the first interlayer insulating film 18 for insulation between the gate electrode 9 and the source electrode film 19 must be patterned by a photoengraving technique and an etching technique, so that it is necessary to have a pattern width larger than a width of the trench 5 taking into consideration a shift of mask positioning upon performing photoengraving. Thus, it is impossible to reduce a mesa width (trench-to-trench distance) to a certain limit or less and miniaturization of the device is hindered.

In view of this, there has been disclosed a structure in which the first interlayer insulating film between the gate electrode and the source electrode film is left only in a width of the trench (refer to Patent Document 2).

FIG. 2 is a cross-sectional view showing a cell portion of other conventional power MOSFET.

As shown in FIG. 2, the first interlayer insulating film 18 is formed only in the trench 5. A top surface of the first interlayer insulating film 18 is formed in a recessed manner relative to the surface of the N-type epitaxial layer 3.

In this structure, even if the mesa width (trench-to-trench distance) is reduced, it is possible to secure a larger contact area in comparison with the case of the structure shown in FIG. 1, the contact area being positioned between the source diffusion layer 13 and the source electrode film 19.

However, this structure poses a problem in that it is difficult to process a film thickness of the first interlayer insulating film 18 in a well-controlled manner. Taking into consideration a change of the film thickness of the first interlayer insulating film 18, it is necessary to have a surface of the gate electrode 9 lower than the surface of the epitaxial layer 3 in accordance with the change of the film thickness. Accordingly, depths of the body diffusion layer 11, the source diffusion layer 13, and the trench 5 are required to be larger, so that longer manufacturing time is necessary and manufacturing of a low volume power MOSFET is hindered.

Moreover, in the conventional techniques shown in FIG. 1 and FIG. 2, unevenness of the surface of the N-type epitaxial layer 3 in the vicinity of the trench 5 is large, coverage of the source electrode film 19 is deteriorated, and failure such as a void 49 is generated in the source electrode film 19 as shown in FIG. 3.

In accordance with this failure, there have been problems in which a flow of current of the source electrode film 19 is hindered and impact upon wirebonding is not absorbed.

Further, when the source electrode film 19 is plated for bump connection, if the coverage of the source electrode film 19 is not good, a thin portion of the source electrode film 19 is damaged upon plating and the N-type source diffusion layer 13 and the P-type body diffusion layer 11 below the source electrode film 19 are also damaged. In accordance with this, failure of a short circuit between the source electrode film 19 and the N-type epitaxial layer 3 is likely to be generated.

Patent Document 1: Japanese Laid-Open Patent Application No. 2002-26324

Patent Document 2: Japanese Laid-Open Patent Application No. 2001-85685

Due to the above-mentioned reasons, preferably, a lower structure of the source electrode film is made flat.

SUMMARY

In an aspect of this disclosure, there is provided a semiconductor device including a trench-type power MOSFET and a manufacturing method thereof that can insulate the source electrode film from the gate electrode in a well-controlled manner and prevent generation of a void in the source electrode film.

According to another aspect of this disclosure, there is provided a semiconductor device provided with a power MOSFET comprising: a semiconductor substrate constituting a drain; a wench formed on a surface of the semiconductor substrate; a gate electrode in the trench, the gate electrode being made of polysilicon and formed via a gate insulating film; a body diffusion layer on a surface side of the semiconductor substrate, the body diffusion layer being positioned adjacently to the trench and formed shallower than the wench; a source diffusion layer on the surface of the semiconductor substrate, the source diffusion layer being positioned adjacently to the wench and the body diffusion layer and formed shallower than the body diffusion layer; a first interlayer insulating film formed on the gate electrode; and a source electrode film made of a metallic material and formed on the semiconductor substrate, the source electrode film being insulated from the gate electrode and electrically connected to the body diffusion layer and the source diffusion layer, wherein a top surface of the gate electrode and a top surface of the first interlayer insulating film are formed in a recessed manner in the trench relative to the surface of the semiconductor substrate, and a surface portion of the semiconductor substrate for the trench is formed into a tapered shape.

In this disclosure, the term "semiconductor substrate" includes an epitaxially grown layer.

According to another aspect of this disclosure, in the semiconductor device, a portion of the polysilicon of the gate electrode may be extended on the semiconductor substrate and a second interlayer insulating film may be formed between the first interlayer insulating film and the source electrode film on the polysilicon extended on the semiconductor substrate.

According to another aspect of this disclosure, the interlayer insulating film may include a silicon nitride film.

According to another aspect of this disclosure, the interlayer insulating film may be disposed from the gate electrode to the surface portion of the semiconductor substrate for the trench and may have a concave portion on a surface thereof, and a metallic material may be embedded in the concave portion.

According to another aspect of this disclosure, there is provided a method for manufacturing a semiconductor device provided with a power MOSFET, the method comprising the steps of: forming a trench on a semiconductor substrate, the trench having a tapered shape at a surface portion of the semiconductor substrate; forming a gate electrode made of polysilicon by embedding the polysilicon in the trench and then etching and removing a portion on a top surface side of the polysilicon so as to have a top surface recessed relative to the surface of the semiconductor substrate; forming a first interlayer insulating film on the gate electrode, a top surface thereof being recessed relative to the surface of the semiconductor device; and forming a source electrode film on the semiconductor substrate and on the first interlayer insulating film.

In this case, steps of forming a body diffusion layer and a source diffusion layer may be performed before or after the trench is formed.

According to another aspect of this disclosure, in the manufacturing method, in the gate electrode forming step, a portion of the polysilicon may be extended on the semiconductor substrate and remain, the method may include the step of: forming a second interlayer insulating film on the first interlayer insulating film on the polysilicon extended on the semiconductor substrate between the first interlayer insulating film forming step and the source electrode film forming step, and in the source electrode film forming step, the source electrode film may be formed on the semiconductor substrate, on the first interlayer insulating film, and on the second interlayer insulating film.

According to another aspect of this disclosure, in the interlayer insulating film forming step, an interlayer insulating film including a silicon nitride film may be formed.

According to another aspect of this disclosure, in the interlayer insulating film forming step, the interlayer insulating film may be disposed from the gate electrode to the surface portion of the semiconductor substrate for the trench and have a concave portion on a surface thereof, and a metallic material may be embedded in the concave portion between the interlayer insulating film forming step and the source electrode film forming step.

According to another aspect of this disclosure, the trench forming step may include the step of performing a thermal oxidation process so as to form the surface portion of the semiconductor substrate for the wench into a tapered shape after the trench is formed on the semiconductor substrate.

According to another aspect of this disclosure, the trench forming step may include the step of forming a concave portion by isotropic etching at an area on the semiconductor substrate where a trench is to be formed, and then forming the trench with a width smaller than the concave portion and a depth larger than the concave portion.

In the semiconductor device according to this disclosure, the top surface of the gate electrode and the top surface of the first interlayer insulating film between the gate electrode and the source electrode are formed in a recessed manner in the trench relative to the surface of the semiconductor substrate, and the surface portion of the semiconductor substrate for the trench is formed into a tapered shape.

The above-mentioned manufacturing method comprises the steps of: forming the trench on the semiconductor substrate, the trench having the tapered shape at the surface portion of the semiconductor substrate; forming a gate electrode made of polysilicon in the trench so as to have the top surface recessed relative to the surface of the semiconductor substrate; forming the first interlayer insulating film on the gate electrode, the top surface thereof being recessed relative to the surface of the semiconductor device; and forming the source electrode film on the semiconductor substrate and on the first interlayer insulating film.

According to the semiconductor device and the manufacturing method thereof, the trench has the tapered shape at the surface portion of the semiconductor substrate, so that it is possible to have a good coverage of the source electrode film and prevent generation of a void in the source electrode film. Due to the good coverage of the source electrode film, damage to the wire bonding and bump plating is reduced. Further, the top surface of the first interlayer insulating film is recessed relative to the surface of the semiconductor substrate, so that the film thickness of the source electrode film is increased on the gate electrode and it is possible to reduce resistance of the source electrode film.

Moreover, by forming the surface portion of the semiconductor device of the trench into the tapered shape, it is possible to form the first interlayer insulating film with the good coverage and a stable thickness and to stably insulate the gate electrode from the source electrode film. Further, by having the stable film thickness of the first interlayer insulating film, it is possible to have a stable parasitic capacity between the gate electrode and the source electrode film.

In the above-mentioned semiconductor device, a portion of the polysilicon of the gate electrode is extended on the semiconductor substrate and the second interlayer insulating film is formed between the first interlayer insulating film and the source electrode film on the polysilicon extended on the semiconductor substrate.

In the above-mentioned manufacturing method, in the gate electrode forming step, a portion of the polysilicon may be extended on the semiconductor substrate and remain, the method may include the step of forming the second interlayer insulating film on the first interlayer insulating film on the polysilicon extended on the semiconductor substrate between the first interlayer insulating film forming step and the source electrode film forming step, and in the source electrode film forming step, the source electrode film may be formed on the semiconductor substrate, on the first interlayer insulating film, and on the second interlayer insulating film.

In accordance with this, it is possible to separately form the second interlayer insulating film with a film thickness different from that of the first interlayer insulating film. And, it is possible to cover a large difference of steps in the extending portion with the second interlayer insulating film and improve insulation between the gate electrode and the source electrode film.

In the above-mentioned semiconductor device, the interlayer insulating film may include a silicon nitride film.

In the above-mentioned manufacturing method, in the interlayer insulating film forming step, an interlayer insulating film including a silicon nitride film may be formed.

In accordance with this, when BPSG (Boro-Phospho Silicate glass) is formed as the second interlayer insulating film, for example, it is possible to prevent moisture, hydrogen, impurity ions, and the like from infiltrating into the gate electrode from above the interlayer insulating film, and to reduce time variability of the threshold voltage of the power MOSFET.

In the above-mentioned semiconductor device, the interlayer insulating film may be disposed from the gate electrode to the surface portion of the semiconductor substrate for the trench and have a concave portion on the surface thereof, and a metallic material may be embedded in the concave portion.

In the above-mentioned manufacturing method, in the interlayer insulating film forming step, the interlayer insulating film may be disposed from the gate electrode to the surface portion of the semiconductor substrate for the trench and have a concave portion on the surface thereof, and the method may include the step of embedding a metallic material in the concave portion between the interlayer insulating film forming step and the source electrode film forming step.

In accordance with this, it is possible to reduce unevenness on the gate electrode and have a good coverage of the source electrode.

In the above-mentioned manufacturing method, the trench forming step may include the step of performing a thermal oxidation process so as to form the surface portion of the semiconductor substrate for the trench into a tapered shape after the trench is formed on the semiconductor substrate or the step of forming a concave portion by isotropic etching at an area on the semiconductor substrate where a trench is to be formed, and then forming the trench with a width smaller than the concave portion and a depth larger than the concave portion. In accordance with this, it is possible to form a trench having a tapered shape on the surface portion of the semiconductor device.

Other aspects, features and advantages will become more apparent from the following detailed description when read in conjunction with the accompanying drawings.

DETAILED DESCRIPTION OF THE PREFERRED EMBODIMENTS

In the following, embodiments of the present invention will be described with reference to the accompanying drawings.

Figure 4:
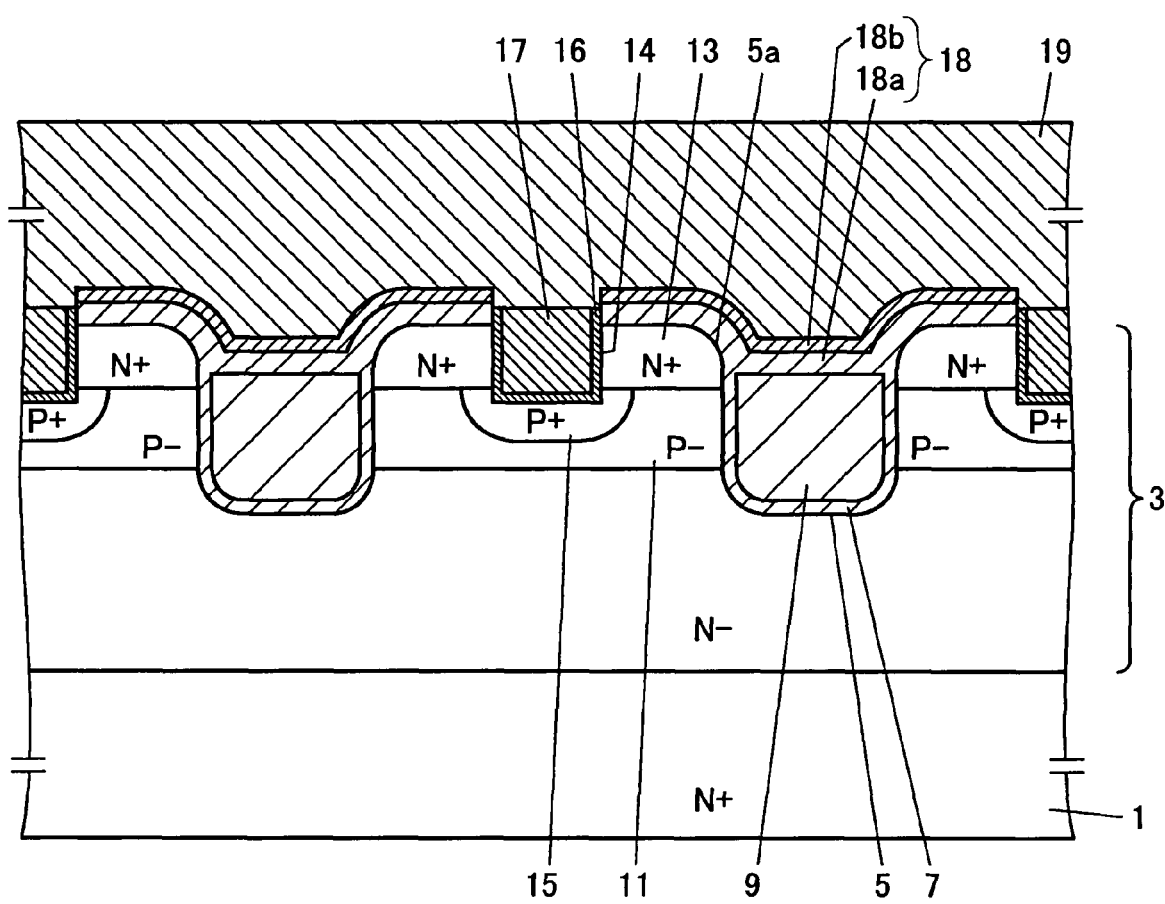
FIG. 4 is a cross-sectional view showing a cell portion of a semiconductor device according to an embodiment.
Figure 5:
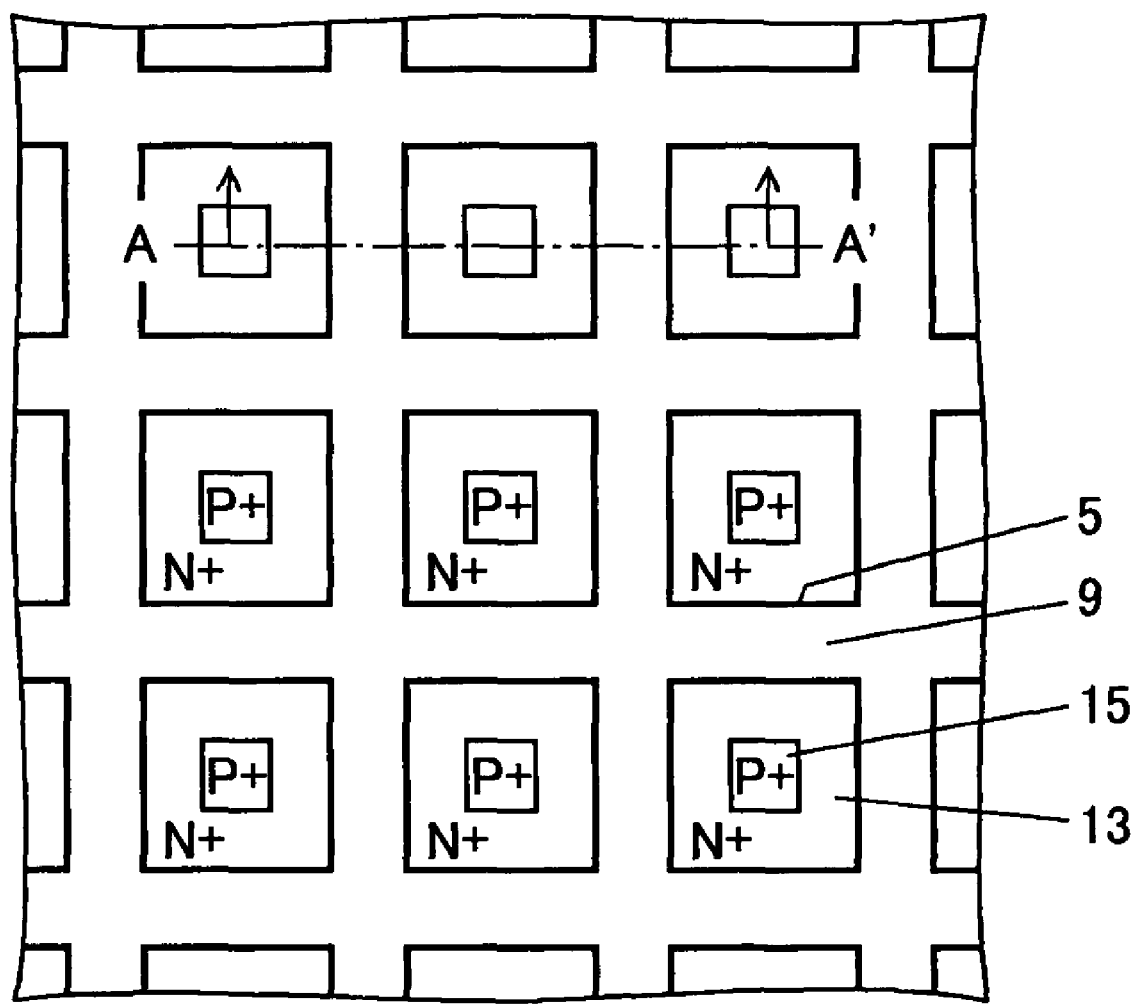
FIG. 5 is a plan view showing a cell portion in the embodiment.
Figure 6:
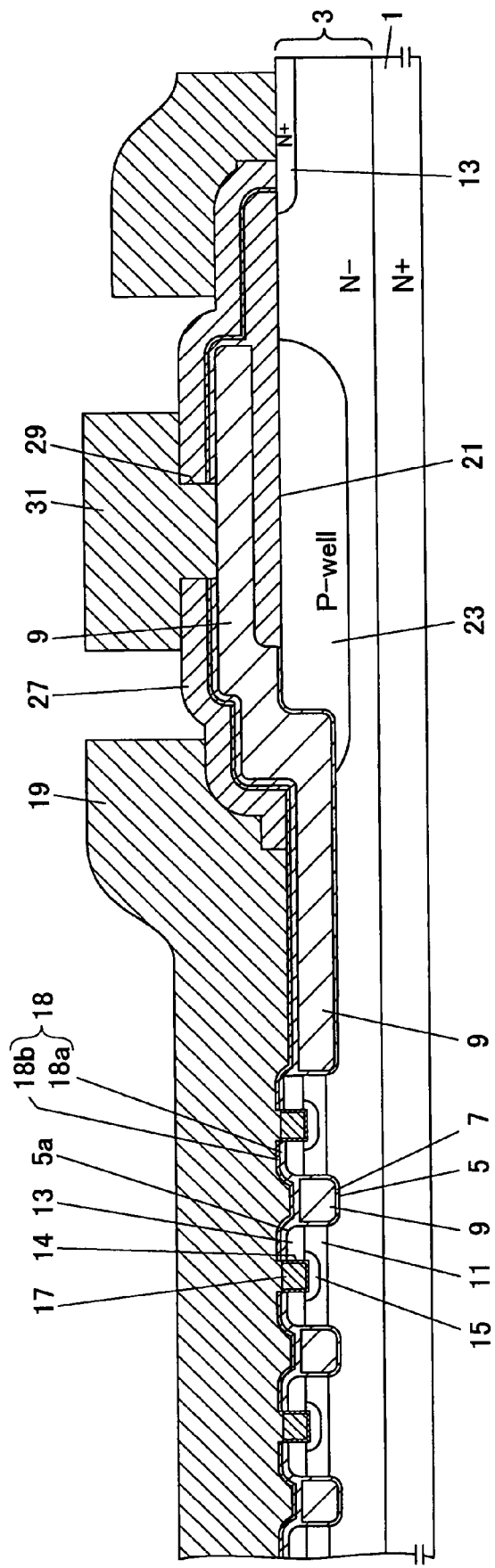
FIG. 6 is a cross-sectional view including a polysilicon extending portion in the embodiment.
Figure 7:
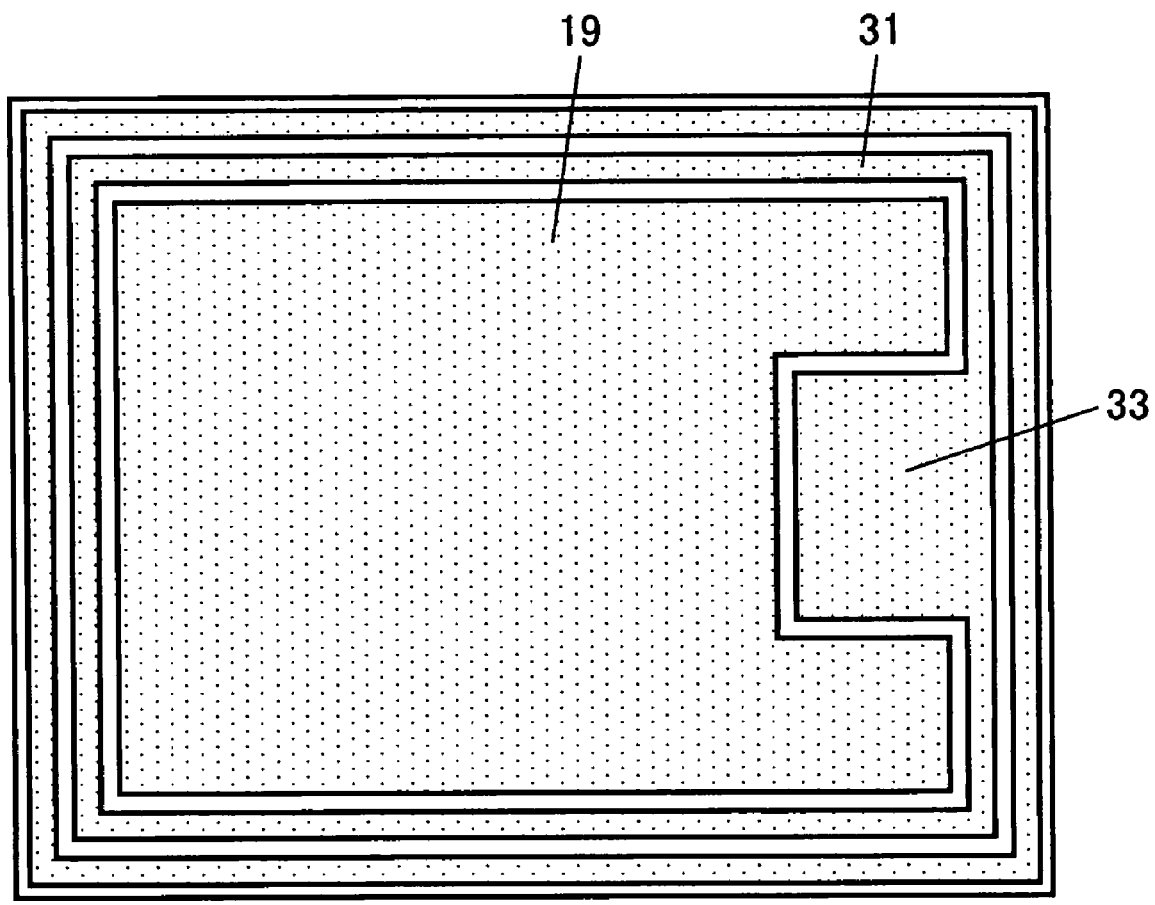
FIG. 7 is a plan view showing an entire portion in the embodiment.

FIG. 4 is a cross-sectional view showing a cell portion of a semiconductor device according to an embodiment. FIG. 5 is a plan view showing a cell portion in the embodiment. FIG. 6 is a cross-sectional view including a polysilicon extending portion in the embodiment. FIG. 7 is a plan view showing an entire portion in the embodiment. The cross-sectional view of FIG. 4 corresponds to line A-A' in FIG. 5.

First, the sell portion according to the embodiment is described with reference to FIG. 4 and FIG. 5.

The N-type epitaxial layer (N−) 3 formed by epitaxial growth is formed on the surface of the N-type single-crystal silicone substrate (N+) 1. For example, the N-type single-crystal silicone substrate 1 has resistivity of $6.0 \times 10^{-3}$ Ω·cm and a thickness of 625 μm (micrometers). The N-type epitaxial layer 3 has resistivity of 0.2 Ω·cm and a thickness ranging from 4.0 to 5.0 μm. The N-type single-crystal silicone substrate 1 and the N-type epitaxial layer 3 constitute a drain.

The trench 5 is formed on the surface of the N-type epitaxial layer 3 opposite to the N-type single-crystal silicone substrate 1. As shown in FIG. 5, the trenches 5 are formed so as to divide the surface of the N-type epitaxial layer 3 in a grid-like manner. For example, the trench 5 has a width of 0.5 μm and a depth of 1.5 μm. A shoulder portion (surface portion of the semiconductor substrate) 5a of the trench 5 is formed into a tapered shape (refer to FIG. 4).

The gate insulating film 7 (not shown in FIG. 5) made of a silicon oxide film, for example, is formed on the inner wall of the trench 5. A film thickness of the silicon oxide film constituting the gate insulating film 7 is 30 nm (nanometers), for example.

The gate electrode 9 made of polysilicon is formed in the trench 5 via the gate insulating film 7. A top surface of the gate electrode 9 is formed in a recessed manner relative to the surface of the N-type epitaxial layer 3 in the trench 5. In this case, a recess depth (etching depth from the surface of the N-type epitaxial layer 3) is 0.4 μm, for example.

The P-type body diffusion layer (P−) 11 is formed adjacently to the trench 5 on the surface side of the N-type epitaxial layer 3. The P-type body diffusion layer 11 is formed shallower than the trench 5. A depth of formation of the P-type body diffusion layer 11 is 1.1 μm, for example.

The N-type source diffusion layer 13 is formed adjacently to the trench 5 on the surface of the N-type epitaxial layer 3. A depth of formation of the N-type source diffusion layer 13 is required to be shallower than the P-type body diffusion layer 11 and deeper than the recess. An example of such a depth is 0.5 μm.

A source trench 14 is formed on the surface of the N-type epitaxial layer 3 with a certain distance from the trench 5. The source trench 14 is formed deeper than the N-type source diffusion layer 13 as to reach the P-type body diffusion layer 11. An example of such a depth is 0.6 μm.

The P-type contact diffusion layer (P+) 15 is formed on the P-type body diffusion layer 11 while surrounding a bottom of the source trench 14 and having a certain distance from the trench 5.

A barrier metal 16 is formed on an inner wall of the source trench 14. Tungsten is embedded in the source trench 14 via the barrier metal 16 and a tungsten plug 17 is formed.

The source trench 14, barrier metal 16, and tungsten plug 17 are omitted in FIG. 5.

The first interlayer insulating film 18 is formed on the gate electrode 9, including a lower layer made of a silicon oxide film 18a and an upper layer made of a silicon nitride film 18b, for example. The first interlayer insulating film 18 covers the shoulder portion 5a of the trench 5 and the N-type source diffusion layer 13 but is not formed on an area where the source trench 14 is formed. A film thickness of the silicon oxide film 18a is about 250 nm, for example, and a film thickness of the silicon nitride film 18b is about 30 nm, for example.

The source electrode film 19 made of a metallic film such as aluminum metal is formed on the source trench 14 and the first interlayer insulating film 18. An example of a film thickness of the source electrode film 19 ranges from 4 to 6 μm.

The first interlayer insulating film 18 and the source electrode film 19 are omitted in FIG. 5.

A drain electrode (not shown in the drawings) made of a metallic film such as silver is formed on a surface opposite to the N-type epitaxial layer 3 opposite to the N-type single-crystal silicone substrate 1.

In the following, the extending portion of the gate electrode 9 and an entire structure are described with reference to FIG. 6 and FIG. 7.

In the vicinity of a circumferential portion of the N-type epitaxial layer 3, a field oxide film 21 made of a silicon oxide film, for example, is formed into a frame-like shape. The extending portion of the gate electrode 9 is disposed on a central side relative to the field oxide film 21 when viewed from above. A P-type well (P-well) 23 is formed on the N-type epitaxial layer 3 from below the field oxide film 21 to the vicinity of the extending portion of the gate electrode 9.

The N-type source diffusion layer (N+) 13 is formed on the circumferential portion of the N-type epitaxial layer 3.

The gate electrode 9 is extended on the N-type epitaxial layer 3 in the vicinity of a circumferential portion of the cell portion and is elongated on the field oxide film 21. In the same manner as in the cell portion, the gate electrode 9 extended on the N-type epitaxial layer 3 also includes thereon the first interlayer insulating film 18 made of the silicon oxide film 18a and the silicon nitride film 18b.

On the gate electrode 9 extended on the N-type epitaxial layer 3, a second interlayer insulating film 27 made of a silicon oxide film, for example, is formed between the first interlayer insulating film 18 and the source electrode film 19. The second interlayer insulating film 27 is also formed on the gate electrode 9 disposed on the field oxide film 21. On the gate electrode 9 disposed on the field oxide film 21, a connection hole 29 is formed on the first interlayer insulating film 18 and the second interlayer insulating film 27. In the connection hole 29, there are formed barrier metal and a tungsten plug (not shown in the drawings) formed together with the barrier metal 16 and the tungsten plug 17. The connection hole 29 has a width larger than that of the source trench 14, so that the tungsten plug in the connection hole 29 thinly remains on a side wall of the connection hole 29 through an etchback process. On the second interlayer insulating film 27 and in the connection hole 29, a metallic film 31 for a gate electrode is formed such that it is formed together with the source electrode film 19 and insulated from the source electrode film 19. As shown in FIG. 7, the metallic film 31 is formed into a frame-like shape and is connected to a gate pad 33.

In the power MOSFET having such a structure, when a voltage not less than a threshold voltage is applied between the gate electrode 9 and the N-type source diffusion layer 13 while a high voltage is applied between the N-type epitaxial layer 3 and the source electrode film 19, an inversion layer is formed on an interface between the gate insulating film 7 and the P-type body diffusion layer 11. Current flows from the drain to the source through the inversion layer.

In this embodiment, the top surface of the gate electrode 9 and a top surface of the first interlayer insulating film 18 are formed in a recessed manner relative to the top surface of the N-type epitaxial layer 3 in the trench 5. And the shoulder portion 5a of the trench 5 is formed into a tapered shape. In accordance with this, it is possible to have a good coverage of the source electrode film 19 and prevent generation of a void in the source electrode film 19. Due to the good coverage of the source electrode film 19, damage to the wire bonding and bump plating is reduced. Further, the top surface of the first interlayer insulating film 18 is recessed relative to the surface of the N-type epitaxial layer 3 in the trench 5, so that the film thickness of the source electrode film 19 is increased on the gate electrode 9 of the cell portion and it is possible to reduce resistance of the source electrode film 19.

Moreover, by forming the shoulder portion 5a of the trench 5 into a tapered shape, it is possible to form the first interlayer insulating film 18 with the good coverage and a stable film thickness and to stably insulate the gate electrode 9 from the source electrode film 19. Further, by having the stable film thickness of the first interlayer insulating film 18, it is possible to have a stable parasitic capacity between the gate electrode 9 and the source electrode film 19.

In addition, the second interlayer insulating film 27 is formed between the first interlayer insulating film 18 and the source electrode film 19 on the gate electrode 9 extended on the N-type epitaxial layer 3. Thus, it is possible to separately form the second interlayer insulating film 27 with a film thickness different from that of the first interlayer insulating film 18. And, it is possible to cover a large difference of steps in the extending portion of the gate electrode 9 with the second interlayer insulating film 27 and improve insulation between the gate electrode 9 and the source electrode film 19.

Further, the first interlayer insulating film 18 includes the silicon nitride film 18b, so that when BPSG (Boro-Phospho Silicate glass) is formed as the second interlayer insulating film 27, for example, it is possible to prevent moisture, hydrogen, impurity ions, and the like from infiltrating into the gate electrode 9 from above the first interlayer insulating film 18, and to reduce time variability of the threshold voltage of the power MOSFET.

FIGS. 8 to 15 are cross-sectional views illustrating steps of an embodiment of a method for manufacturing the semiconductor device shown in FIGS. 4 to 7. References in parentheses in FIGS. 8 to 15 correspond to the manufacturing steps described in the following.

In the following, the embodiment of the manufacturing method is described with reference to FIGS. 4 and 8 to 15.

(a) The N-type epitaxial layer 3 with resistivity of 0.2 Ω·cm and a thickness ranging from 4.0 to 5.0 μm, for example, is formed on the N-type single-crystal silicone substrate 1 with resistivity of $6.0 \times 10^{-3}$ Ω·cm and a thickness of 625 μm, for example. A silicon oxide film having a thickness of about 500 nm is formed by performing a thermal oxidation process on the surface of the N-type epitaxial layer 3. After the silicon oxide film in the vicinity of the circumferential portion of the cell portion of the N-type epitaxial layer 3 is removed in a frame-like shape by the photoengraving technique and the etching technique, a thermally-oxidized film with a thickness of 25 nm is additionally formed and boron ions are implanted into the N-type epitaxial layer 3 by an ion implantation technique while the silicon oxide film is used as a mask. Then, a thermal process is performed and the P-type well 23 is formed on a peripheral portion of the cell portion (refer to FIG. 6). After the thermal oxidation process is performed again so as to form a silicon oxide film having a thickness of about 500 nm, the silicon oxide film formed on the surface of the N-type epitaxial layer 3 of the cell portion is removed by the photoengraving technique and the etching technique. In accordance with this, the field oxide film 21 is formed in the vicinity of the circumferential portion of the cell portion of the N-type epitaxial layer 3 (refer to FIG. 6). Then, a thick silicon oxide film 35 is formed on the N-type epitaxial layer 3 and the field oxide film 21 by the CVD (Chemical Vapor Deposition) method. The silicon oxide film 35 in a area where a trench is to be formed is etched and removed by the photoengraving technique and the etching technique.

(b) The trench 5 having a rectangular shape in a cross section is formed with a width of about 0.5 μm by etching the N-type epitaxial layer 3 by an anisotropic etching technique while the silicon oxide film 35 is used as a mask. The depth of the trench 5 is 1.5 μm in this case so that a bottom thereof is positioned at a position deeper than that of a P-type body diffusion layer to be formed in a later step.

(c) The silicon oxide film 35 is removed.

(d) A thermally-oxidized film 37 is formed on the surface of the N-type epitaxial layer 3 by performing a high-temperature thermal oxidation process in an oxygen atmosphere at about 1100° C., for example. In accordance with this, the shoulder portion 5a and a corner of the bottom of the trench 5 are rounded and the shoulder portion 5a is formed into a tapered shape. The high-temperature thermal oxidation process also functions as dry cleaning on a side surface and the bottom of the trench 5. The rounded shoulder portion Sa has an effect of improving insulation at the shoulder portion of the polysilicon extending portion in the peripheral portion (refer to FIG. 6). The rounded corner of the bottom has an effect of improving insulation of the gate insulating film to be formed in a later step. The thermal process may be performed in a hydrogen atmosphere at about 950° C. as another high-temperature thermal oxidation process.

(e) The thermally-oxidized film 37 is removed.

(f) While the N-type epitaxial layer 3 of the cell portion is exposed, a thermal oxidation process is performed and the gate insulating film 7 including a silicon oxide film is formed. In this case, the gate insulating film 7 is formed with a film thickness of 30 nm.

(g) A polysilicon film 39 doped with phosphorus is formed on the gate insulating film 7 by a CVD method. The trench 5 is filled with the polysilicon film 39. Although the phosphorus-doped polysilicon film 39 is formed in this case, phosphorus may be doped after a non-doped polysilicon film is formed.

(h) A resist pattern covering an area to be formed as the polysilicon extending portion (refer to FIG. 6) is formed by the photoengraving technique. The polysilicon film 39 is etched while the resist pattern is used as a mask and the polysilicon film 39 outside the trench 5 of the cell portion is removed, so that the gate electrode 9 made of polysilicon is formed in the trench 5. In this case, when the polysilicon film 39 outside the trench 5 of the cell portion is completely removed, it is necessary to continue etching even after the polysilicon film 39 outside the trench 5 of the cell portion is removed and to perform etching for a certain period of time such that an upper portion of the polysilicon film 39 filled in the trench 5 is partly removed taking into consideration difference of film thickness of the polysilicon film 39, difference of etching rate, and fluctuation in a wafer plane. In this case, In this case, the recess depth (etching depth from the surface of the N-type epitaxial layer 3) of the gate electrode 9 is 0.4 μm. In this step, the gate insulating film 7 remains on the N-type epitaxial layer 3 and the shoulder portion 5a of the trench 5.

(i) The gate insulating film 7 on the N-type epitaxial layer 3 and the shoulder portion 5a of the trench 5 is removed. A thermal oxidation process is performed and a cap oxide film 41 is formed on the surface of the N-type epitaxial layer 3 and on the top surface of the gate electrode 9 so as to have a film thickness of about 25 nm. In this case, the cap oxide film 41 may be formed by performing an additional oxidation process without removing the gate insulating film 7.

(j) A resist pattern (not shown in the drawings) having an opening for the cell portion is formed by the photoengraving technique. Boron ions are implanted into the N-type epitaxial layer 3 by the ion implantation technique while the resist pattern is used as a mask. After the resist pattern is removed, a thermal diffusion process is performed and the P-type body diffusion layer 11 is formed. For example, by implanting boron ions on the assumption that energy is within a range from 30 to 80 keV and a dose amount is within a range from $5.0 \times 10^{12}$ to $5.0 \times 10^{13}/cm^2$ and by performing the thermal diffusion process at from 1050 to 1100° C. for several tens of minutes, it is possible to form the P-type body diffusion layer 11 with a depth of from about 0.6 to 1.4 μm. The P-type body diffusion layer 11 is formed such that the depth of the P-type body diffusion layer 11 is shallower than the trench 5 and is deeper than that of the surface of the polysilicon gate. In this case, the depth is 1.1 μm.

(k) A resist pattern (not shown in the drawings) having an opening for the cell portion is formed by the photoengraving technique. The cap oxide film 41 is removed.

(l) Phosphorus or arsenic is implanted into the N-type epitaxial layer 3 by the ion implantation technique while the resist pattern is used as a mask. After the resist pattern is removed, the thermal diffusion process is performed and the N-type source diffusion layer 13 is formed. When the arsenic is implanted, for example, by performing the implant on the assumption that energy is within a range from 30 to 100 keV and a dose amount is within a range from $1.0 \times 10^{15}$ to $5.0 \times 10^{16}/cm^2$ and by performing the thermal diffusion process at from 1000 to 1100° C. for several tens of minutes, it is possible to form the N-type source diffusion layer 13 with a depth of from about 0.45 to 0.7 μm. Then, following the thermal diffusion process, a thermally-oxidized film 43 with a thickness of about 25 nm is formed on the surface of the N-type epitaxial layer 3 and on the top surface of the gate electrode 9. A depth of formation of the N-type source diffusion layer 13 is shallower than the trench 5, deeper than the top surface of the gate electrode 9, and shallower than the P-type body diffusion layer 11. In this case, the depth of formation of the N-type source diffusion layer 13 is 0.5 μm.

(m) An NSG (Non-dope Silicon Glass) film is formed on an entire surface of the thermally-oxidized film 43 by the CVD method so as to have a film thickness of about 250 nm and the silicon oxide film 18a is formed, the silicon oxide film 18a being made of a laminated film of the thermally-oxidized film 43 and the NSG film.

(n) The silicon nitride film 18b is formed on the silicon oxide film 18a by the CVD method so as to have a film thickness of about 30 nm. In accordance with this, the first interlayer insulating film 18 made of a laminated film of the silicon oxide film 18a and the silicon nitride film 18b is formed.

(o) A silicon oxide film 45 is formed on the silicon nitride film 18b by the CVD method so as to have a film thickness of about 800 nm, the silicon oxide film 45 being made of a laminated film of an NSG film and a BPSG film. The silicon oxide film 45 is to be formed as the second interlayer insulating film 27 (refer to FIG. 6).

(p) A resist pattern (not shown in the drawings) covering the extending portion of the gate electrode 9 is formed by the photoengraving technique. The silicon oxide film 45 is etched and removed by wet etching using BHF, for example, while the resist pattern is used as a mask and the second interlayer insulating film 27 (refer to FIG. 6) covering the extending portion of the gate electrode 9 is formed. In this status, the first interlayer insulating film 18 remains on the gate electrode 9. The resist pattern is removed. A resist pattern (not shown in the drawings) having an opening for an area where a source trench is to be formed is formed by the photoengraving technique. The first interlayer insulating film 18 is removed by the etching technique while the resist pattern is used as a mask and an opening for the area where the source trench is to be formed is formed. Thereafter, the resist pattern is removed.

(q) A portion on the surface side of the N-type epitaxial layer 3 is removed by the anisotropic etching technique such as reactive ion etching while the first interlayer insulating film 18 is used as a mask and the source trench 14 is formed. A depth of formation of the source trench 14 is deeper than the N-type source diffusion layer 13. In this case, the depth of formation of the source trench 14 is 0.6 μm.

(r) $BF_2$ ions, for example, are implanted into the P-type body diffusion layer 11, by the ion implantation technique, positioned at a bottom of the source trench 14 while the first interlayer insulating film 18 is used as a mask. The ions are implanted on the assumption that implantation energy is within a range from 30 to 60 keV and a dose amount is within a range from $1.0 \times 10^{15}$ to $3.0 \times 10^{15}/cm^2$ and preferably an implantation angle of 0 degree. For example, the thermal diffusion process is performed at from 850 to 950° C. for several tens of minutes and the P-type contact diffusion layer 15 is formed so as to have ohmic contact of the P-type body diffusion layer 11.

(s) With reference to FIG. 6, in the extending portion of the gate electrode 9, the connection hole 29 is formed on the second interlayer insulating film 27 and the first interlayer insulating film 18 on the gate electrode 9 on the field oxide film 21 so as to have contact with the metallic film 31 to be formed in a later step. After the barrier metal 16 made of Ti and TiN, for example, is deposited by a sputtering process, silicide is formed by RTA (Rapid Thermal Annealing) process.

(t) Tungsten is deposited by the CVD method or the like. By performing the etchback on the tungsten and the barrier metal 16, the tungsten plug 17 is formed in the source trench 14 (refer also to FIG. 6).

An aluminum metal film such as AlSi, AlSiCu, and the like is deposited by the sputtering process. The aluminum metal film is patterned and the source electrode film 19 and the metallic film 31 for a gate electrode are formed (refer to FIGS. 4 and 6). Preferably, a film thickness of the aluminum metal film is larger so as to reduce resistance components of the source electrode film 19 and the metallic film 31 for the gate electrode. For example, the aluminum metal film is formed to have a film thickness of from about 4 to 6 μm. Thereafter, a cover film such as PSG, nitride film, or the like is deposited as protection for the source electrode film 19 and the metallic film 31 for the gate electrode, and then a pad opening (not shown in the drawings) is formed by the photoengraving technique and the etching technique. In the end, a rear surface of the N-type single-crystal silicone substrate 1 is ground so as to have a desired thickness and several types of metal are deposited, so that the drain electrode is formed (not shown in the drawings).

Figure 16:
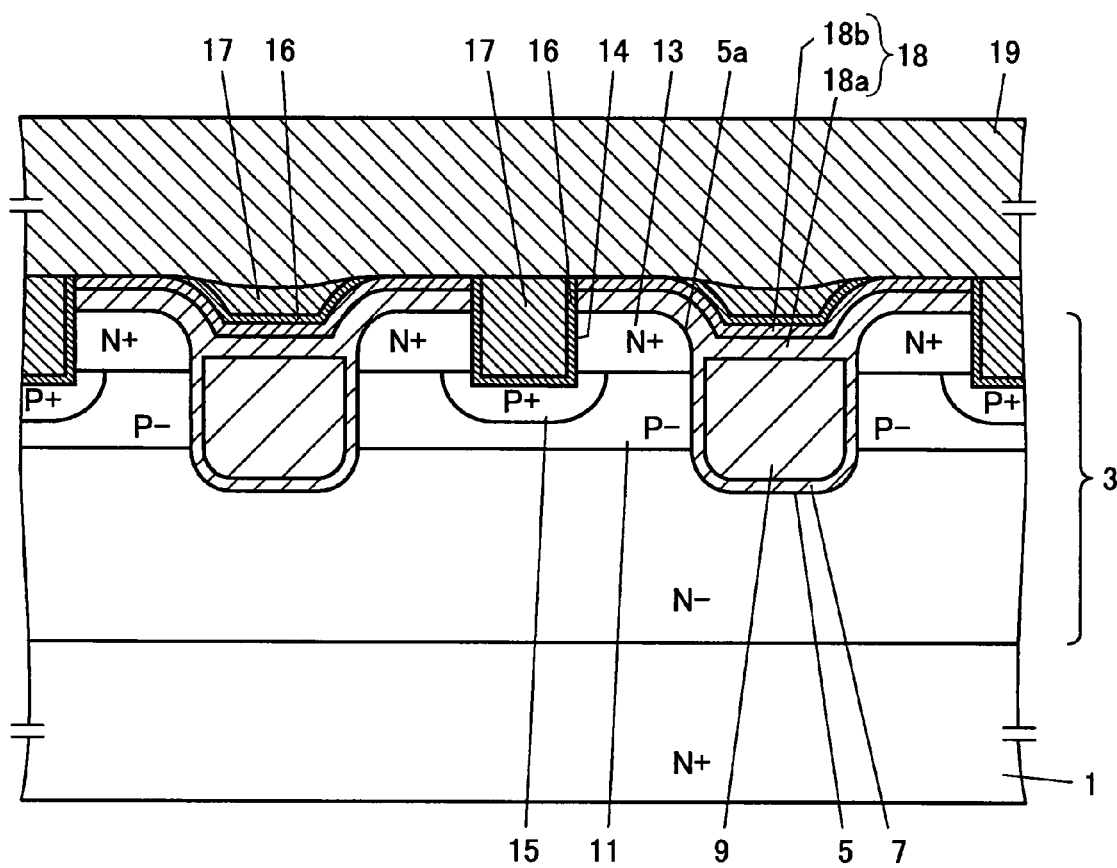
FIG. 16 is a cross-sectional view showing a cell portion of a semiconductor device according to another embodiment.

FIG. 16 is a cross-sectional view showing the cell portion of the semiconductor device according to another embodiment. The same reference numerals are assigned to the same portions as in FIG. 4 and description thereof is omitted.

This embodiment is different from the embodiment shown in FIG. 4 in that the barrier metal 16 and the tungsten plug 17 (metallic materials) remain in a concave portion of the source electrode film 19 formed on the gate electrode 9 in the trench 5. This embodiment is formed by adjusting an amount of etchback on the tungsten and the barrier metal 16 in the above-mentioned step (t) of the aforementioned manufacturing method described with reference to FIGS. 4 and 8 to 15.

The barrier metal 16 and the tungsten plug 17 remain in the concave portion on the first interlayer insulating film 18 formed on the gate electrode 9 in the trench 5, so that flatness is increased and coverage of the source electrode film 19 is improved. Further, the thickness of the source electrode film 19 on the trench 5 is increased including the barrier metal 16 and the tungsten plug 17 and source resistance is improved.

Figure 1:
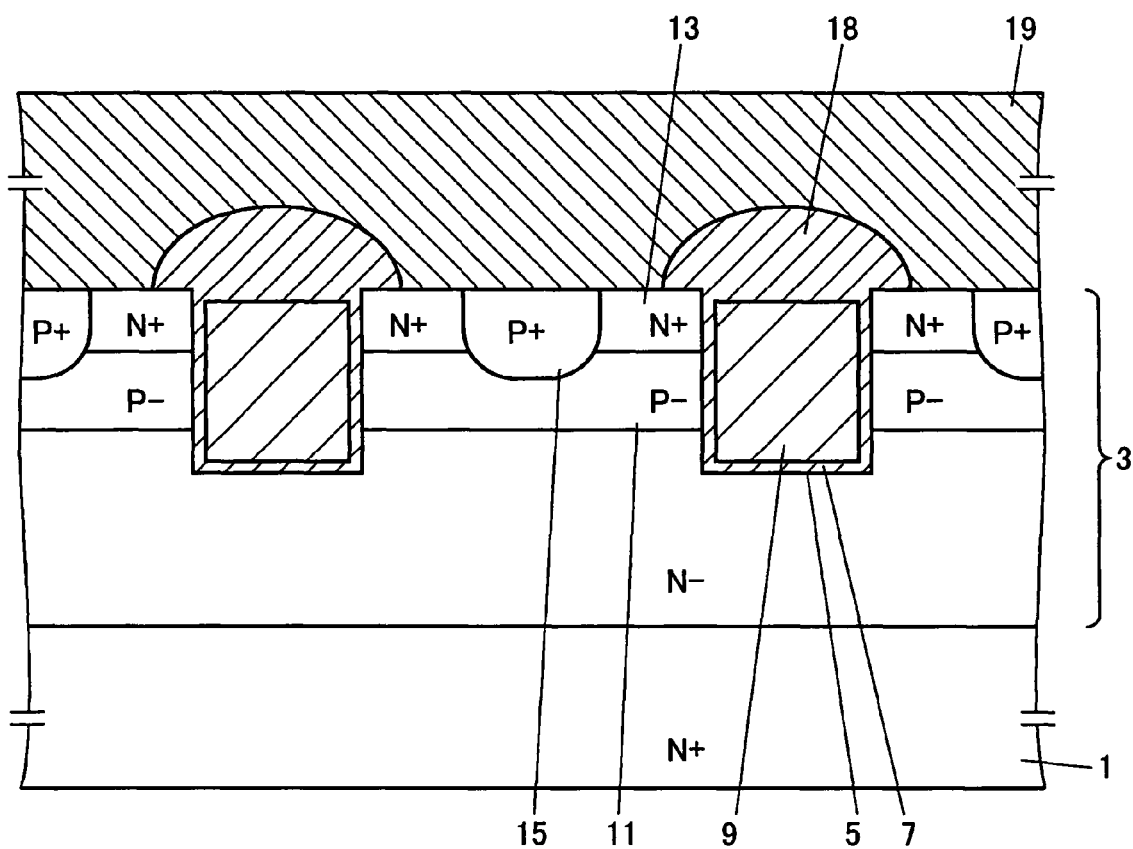
FIG. 1 is a cross-sectional view showing a cell portion of a conventional semiconductor device.
Figure 2:
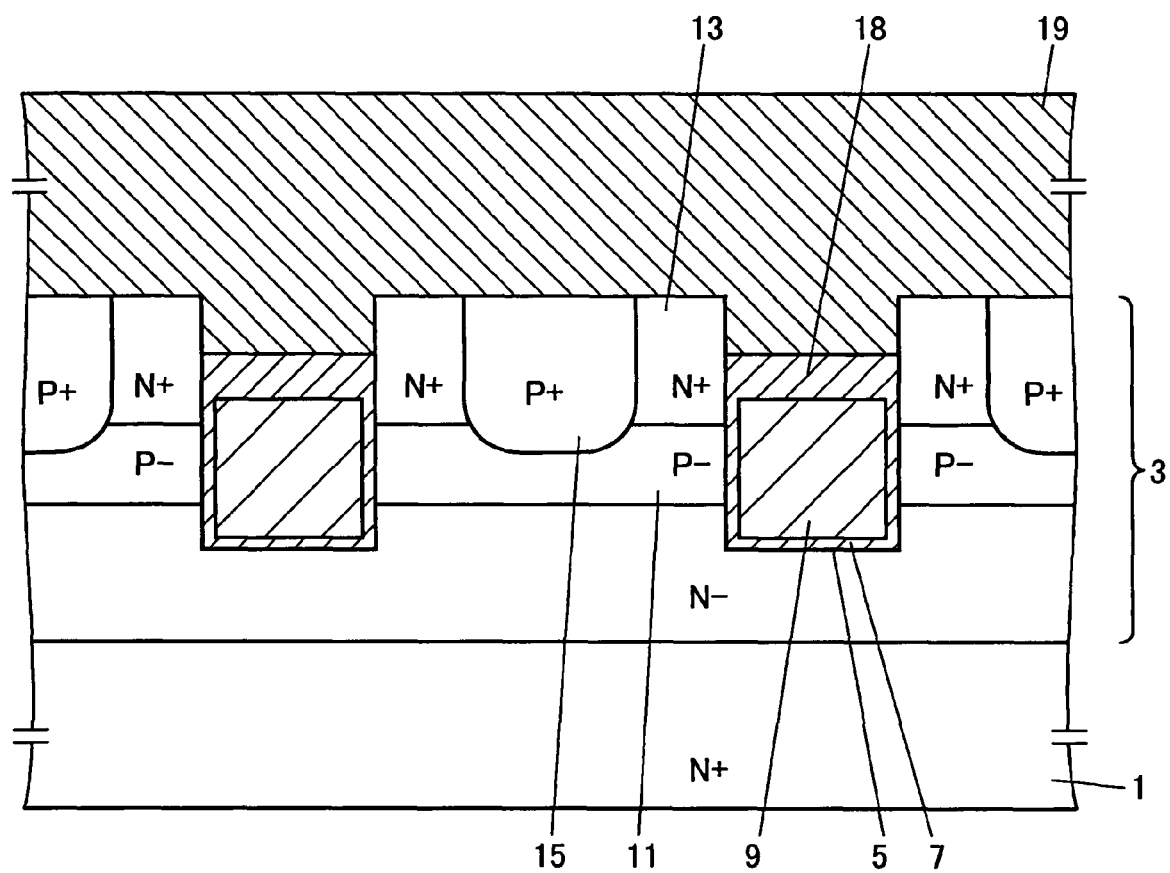
FIG. 2 is a cross-sectional view showing a cell portion of another conventional semiconductor device.
Figure 3:
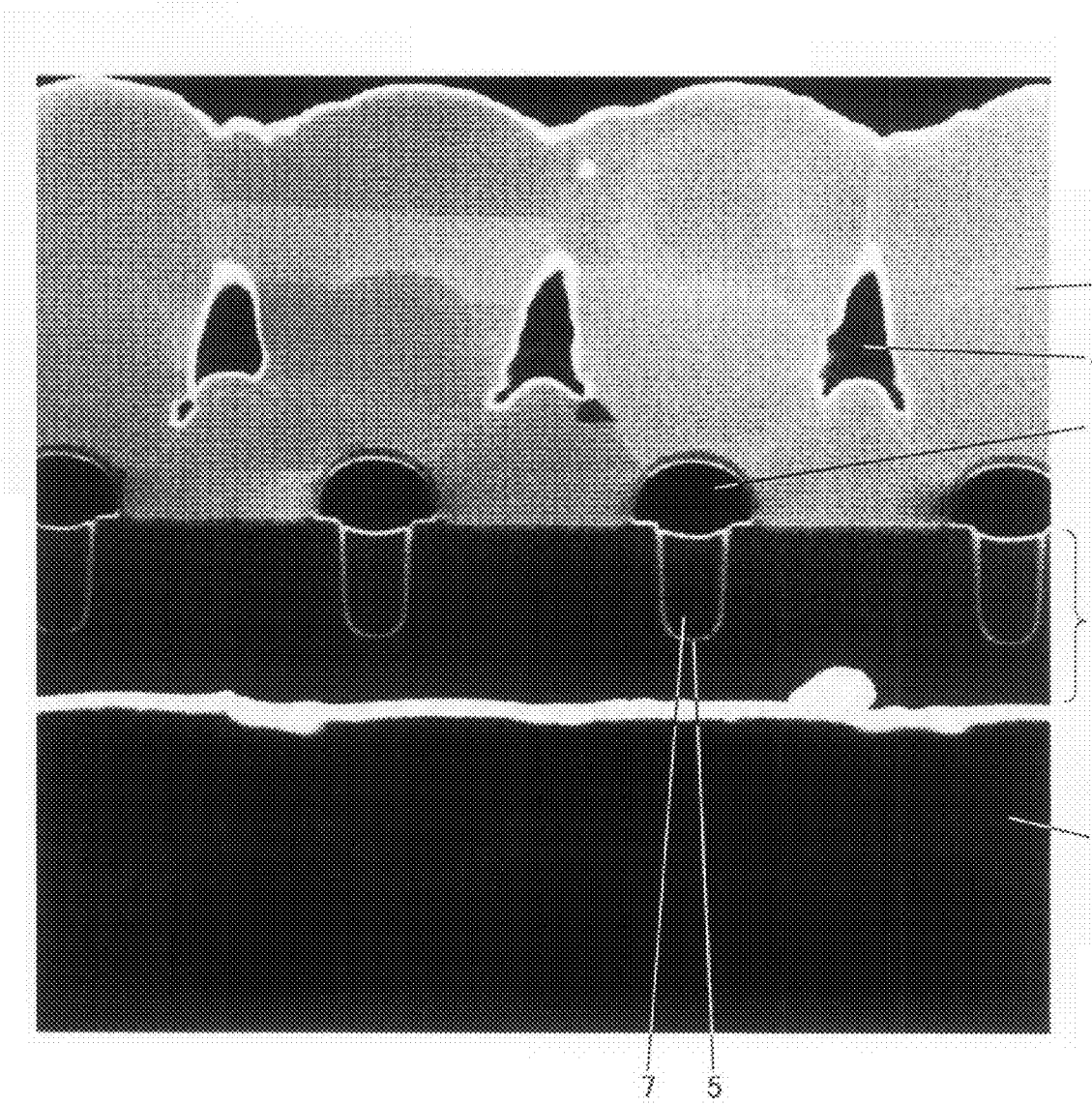
FIG. 3 is a micrograph showing a cross-sectional structure of the conventional semiconductor device shown in FIG. 1.
Figure 17:
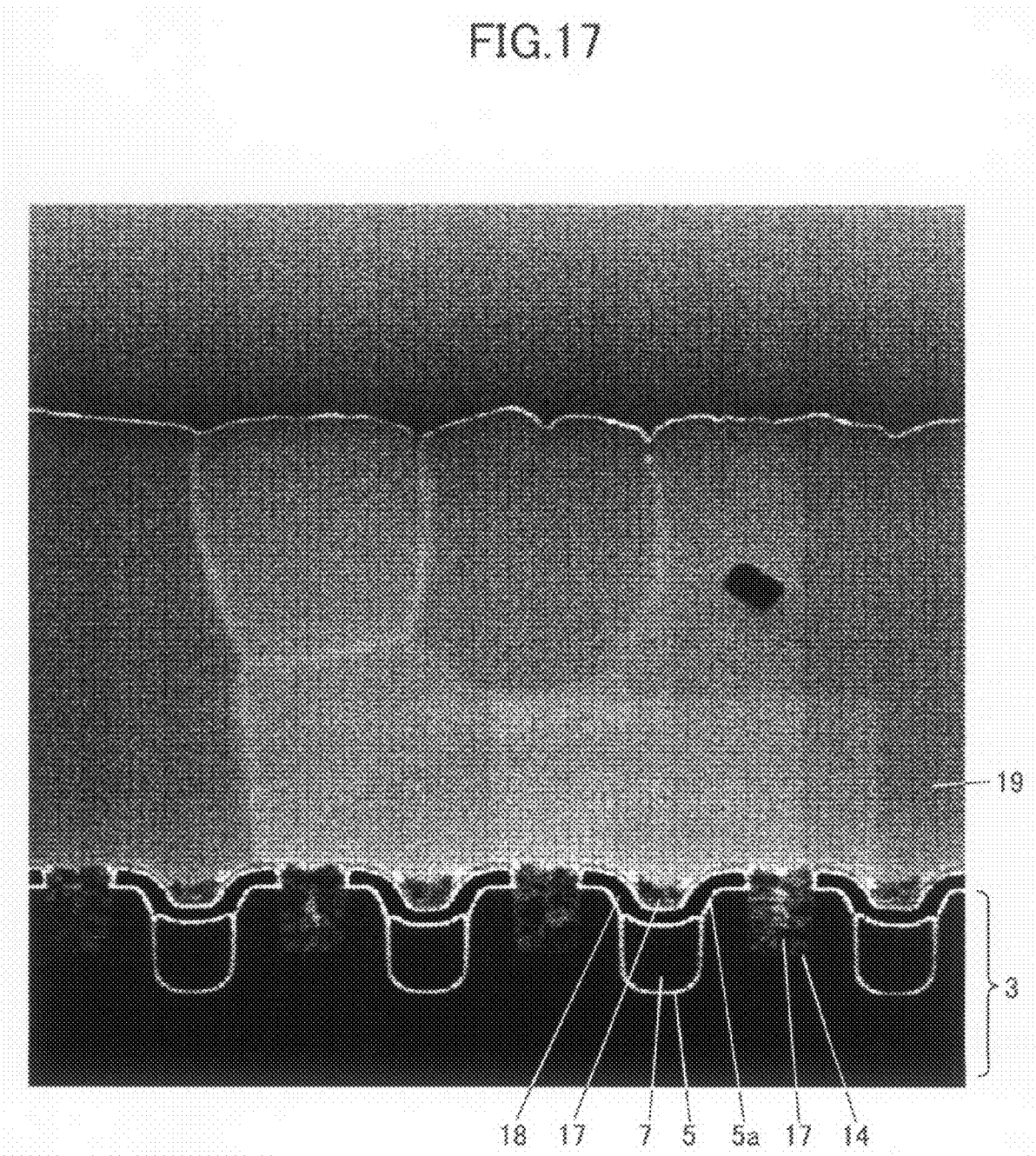
FIG. 17 is a micrograph showing a cross-sectional structure in the embodiment.

FIG. 17 is a photograph of an SEM (scanning electron microscope) showing a cross-sectional structure of the embodiment of FIG. 16. In the conventional technique, the void 49 is generated in the source electrode film 19 as shown in FIG. 3. However, as shown in FIG. 17, such a void is not generated in this embodiment.

In the embodiment of the above-mentioned manufacturing method described with reference to FIGS. 4 and 8 to 15, the thermal oxidation process is used so as to form the tapered shape at the shoulder portion 5a of the trench 5 (refer to step (d) above). However, the manufacturing method according to the present invention is not limited to this.

Figure 18:
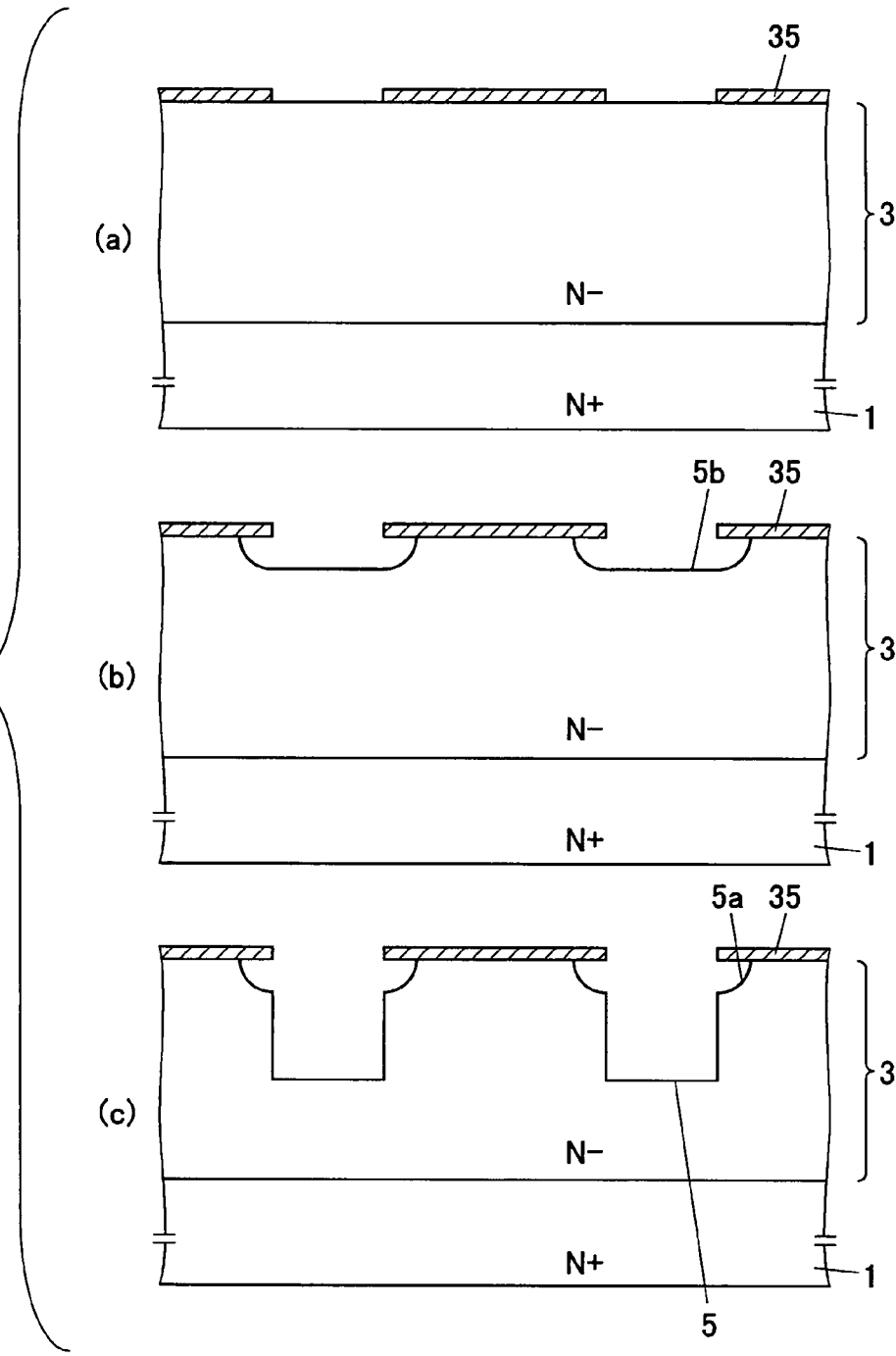
FIG. 18 is a cross-sectional view illustrating a part of a step of a manufacturing method according to another embodiment.

FIG. 18 is a cross-sectional view illustrating a part of a step of a manufacturing method according to another embodiment.

Figure 8:
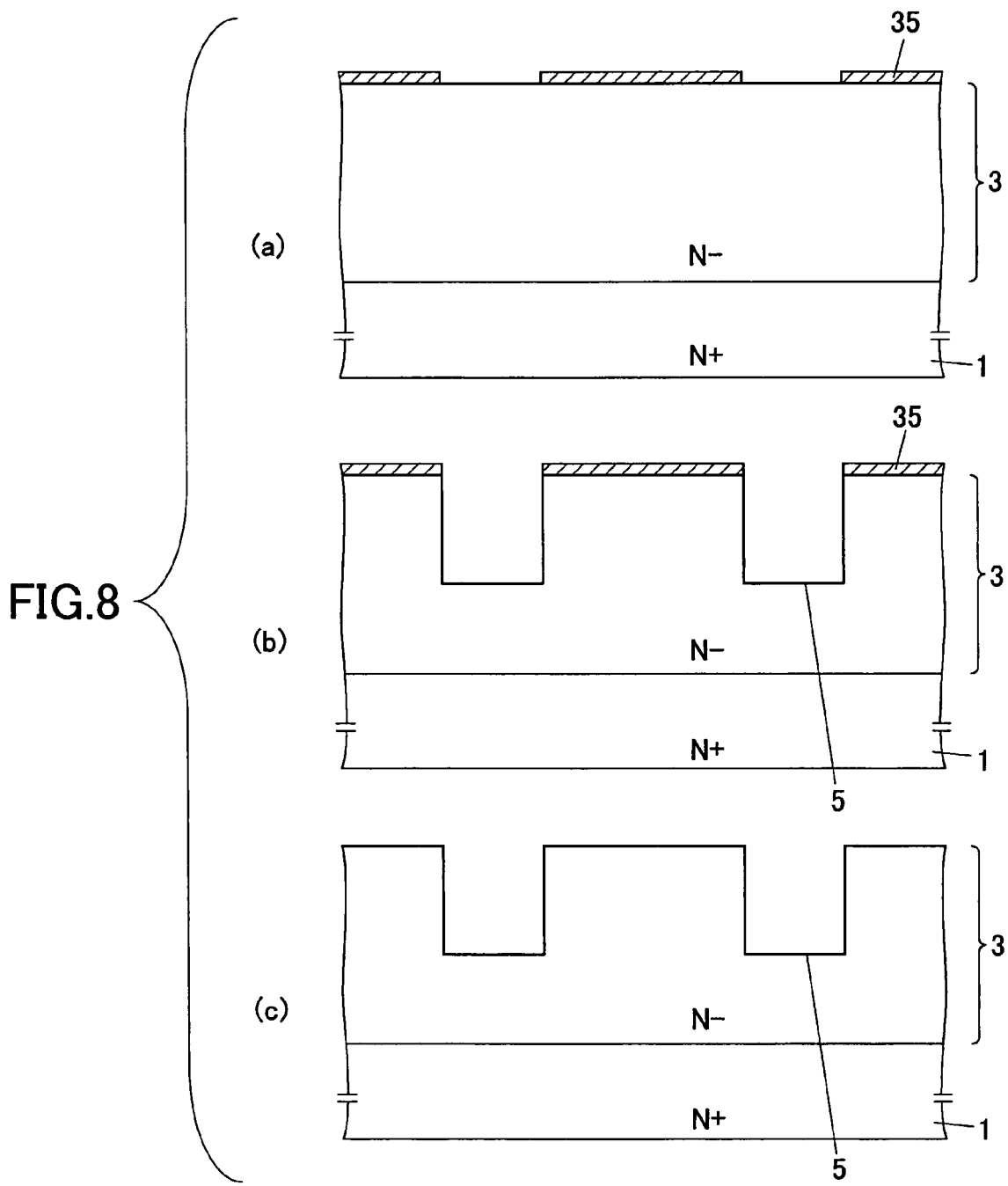
FIG. 8 is a cross-sectional view illustrating a first step of a manufacturing method according to an embodiment.
Figure 9:
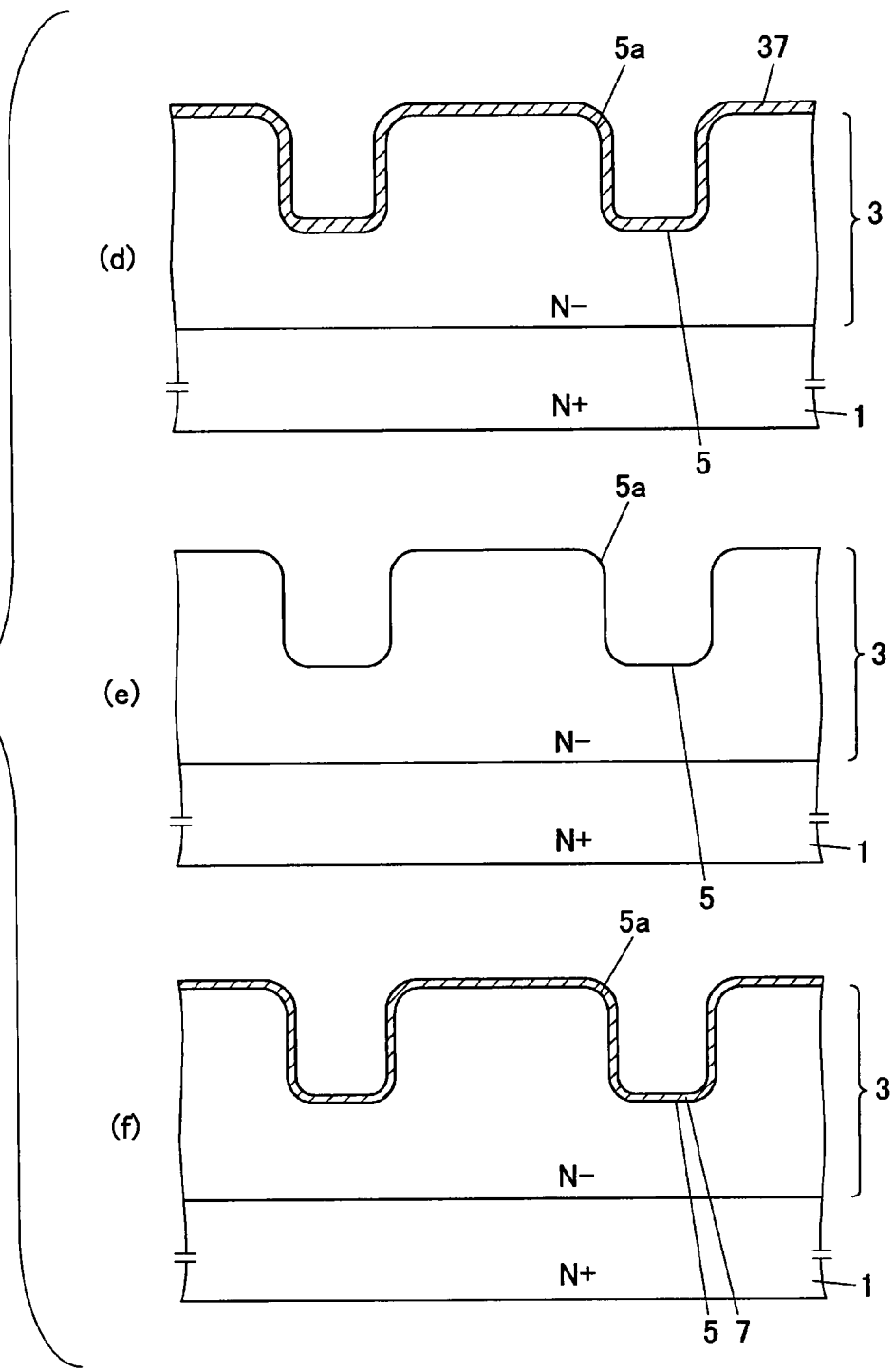
FIG. 9 is a cross-sectional view illustrating a subsequent step in the embodiment.
Figure 10:
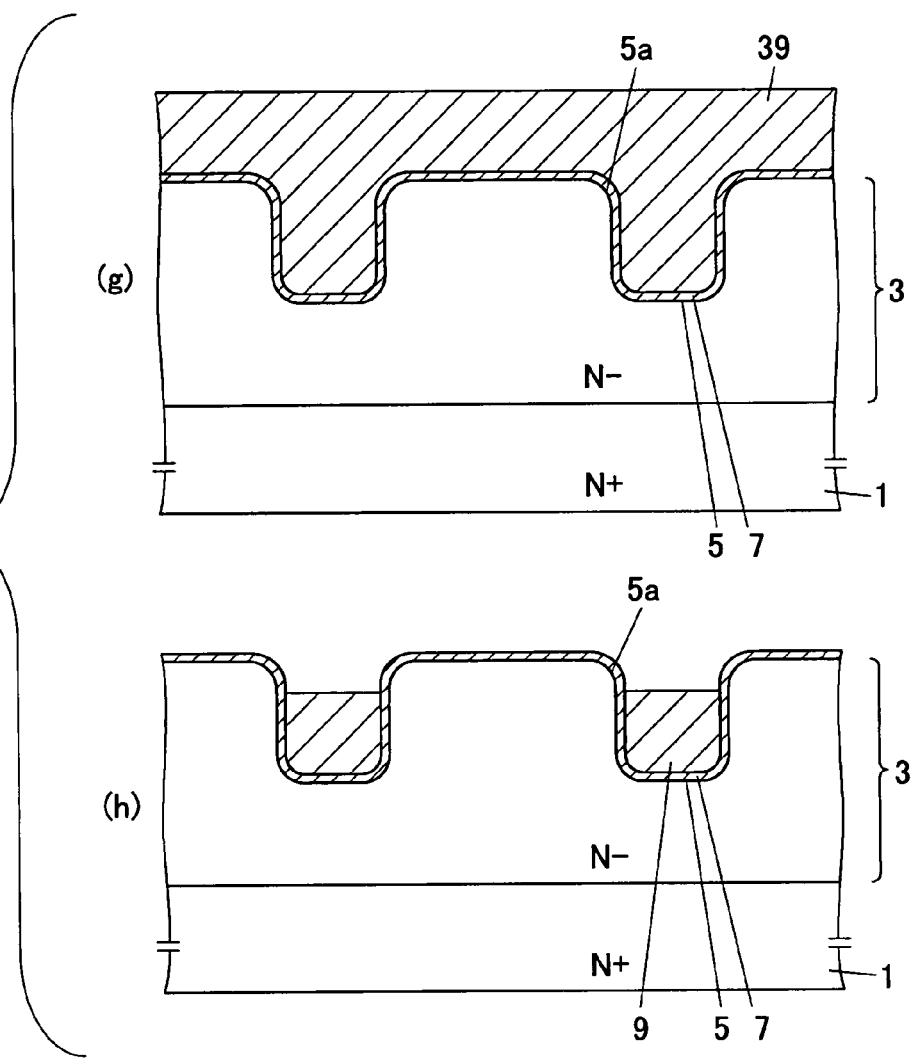
FIG. 10 is a cross-sectional view illustrating a subsequent step in the embodiment.
Figure 11:
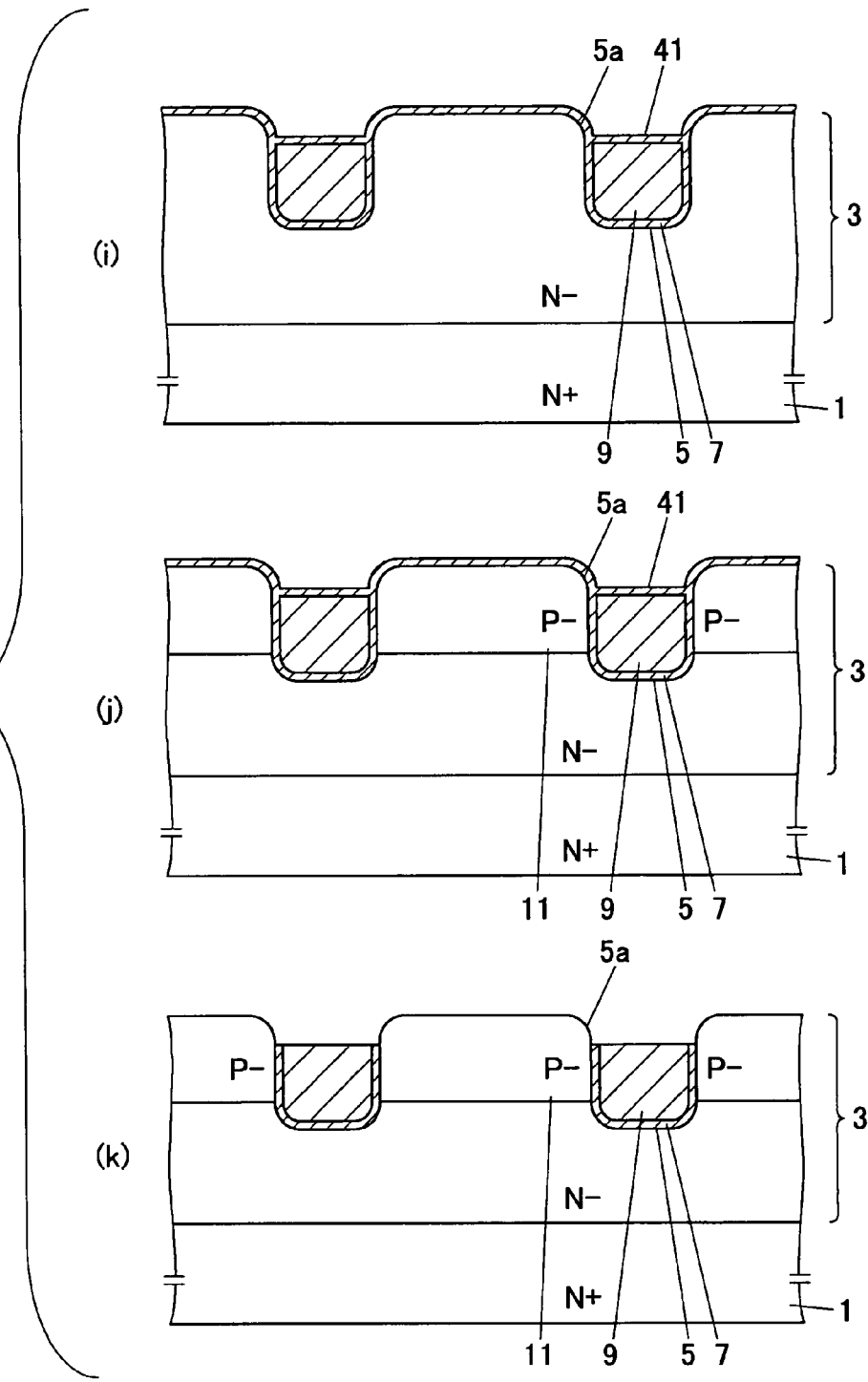
FIG. 11 is a cross-sectional view illustrating a subsequent step in the embodiment.
Figure 12:
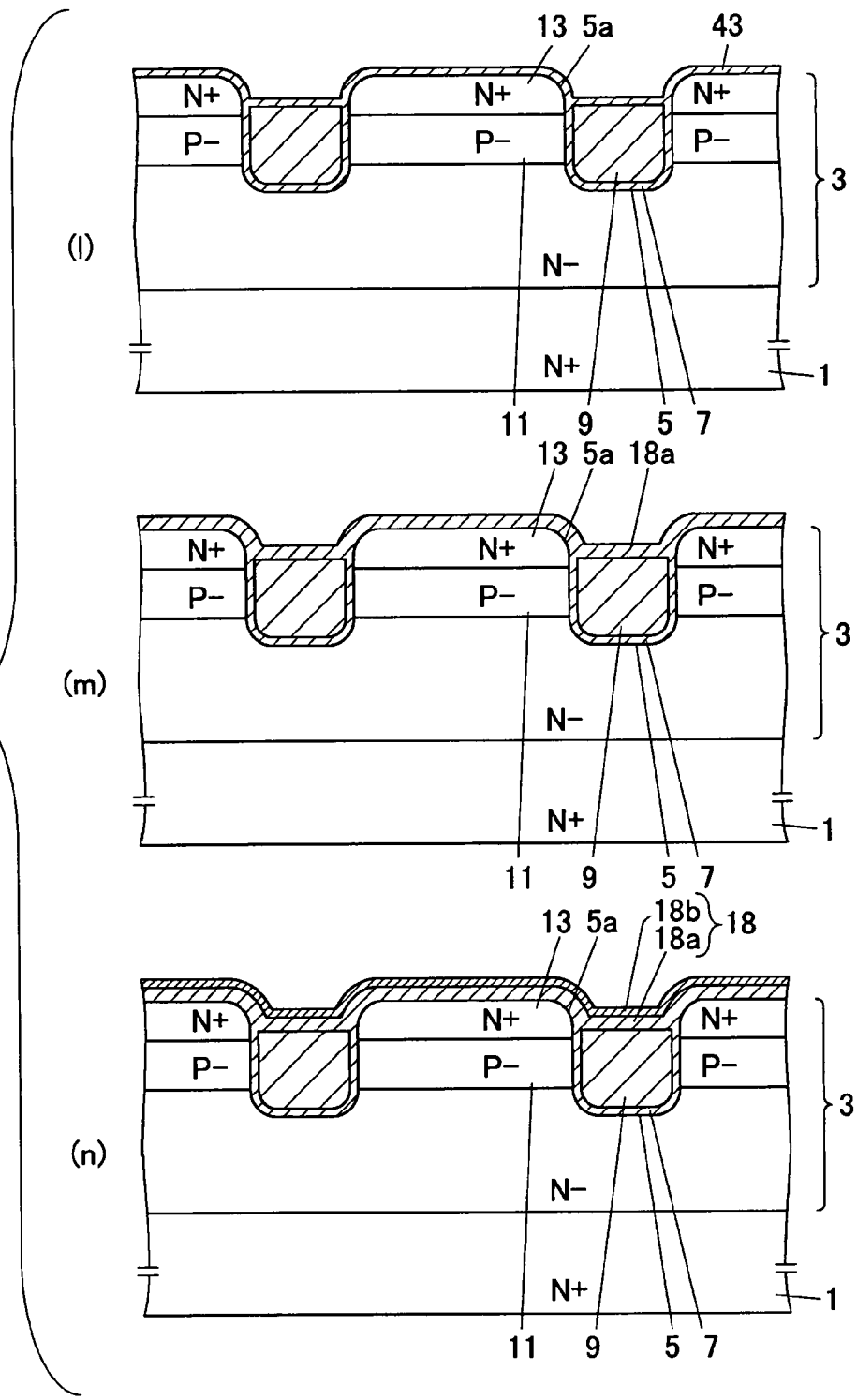
FIG. 12 is a cross-sectional view illustrating a subsequent step in the embodiment.
Figure 13:
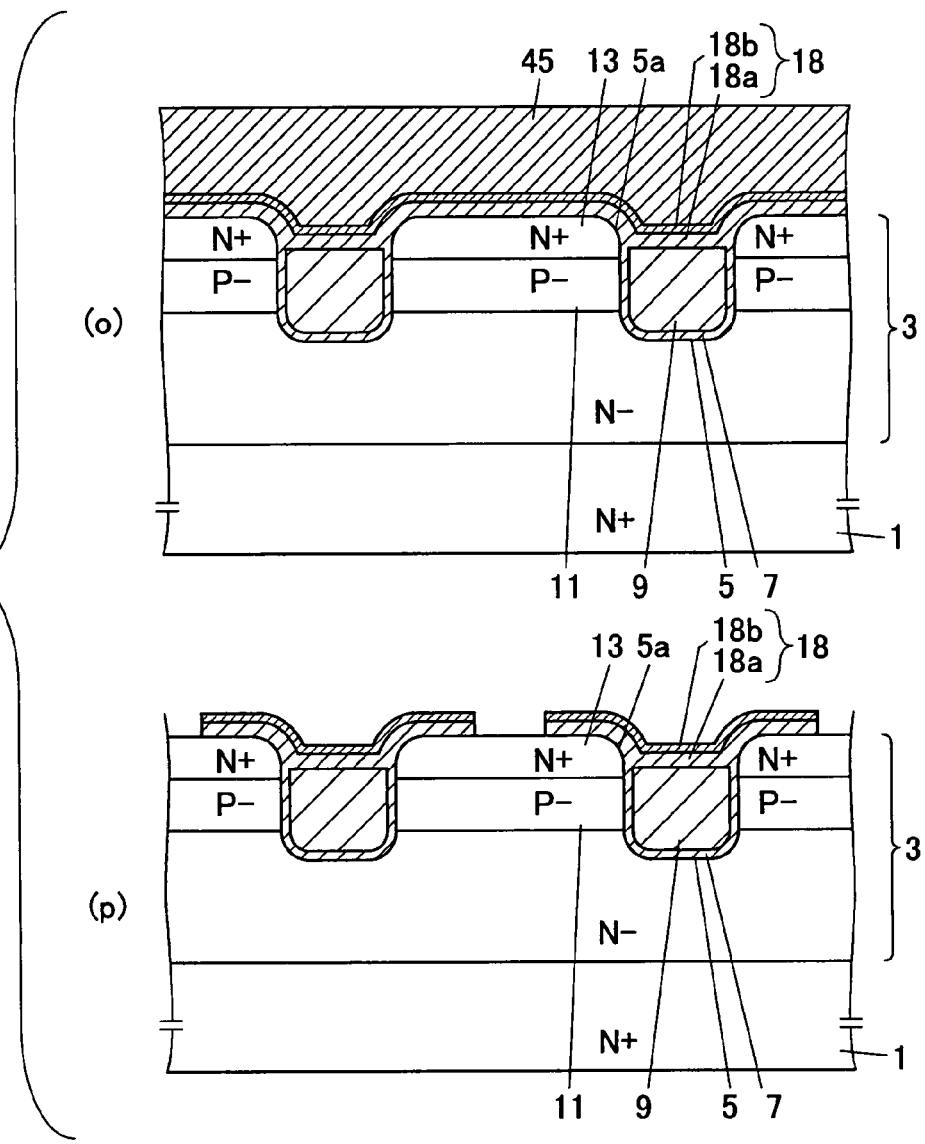
FIG. 13 is a cross-sectional view illustrating a subsequent step in the embodiment.
Figure 14:
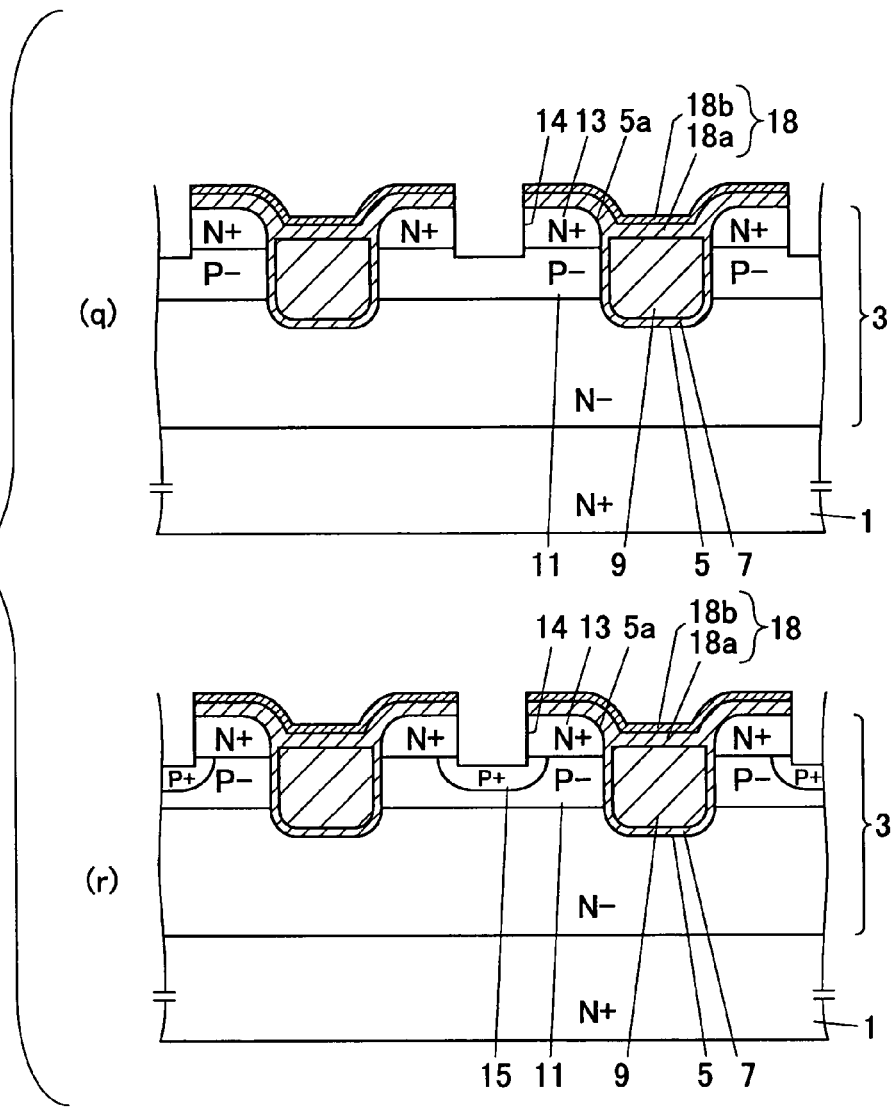
FIG. 14 is a cross-sectional view illustrating a subsequent step in the embodiment.
Figure 15:
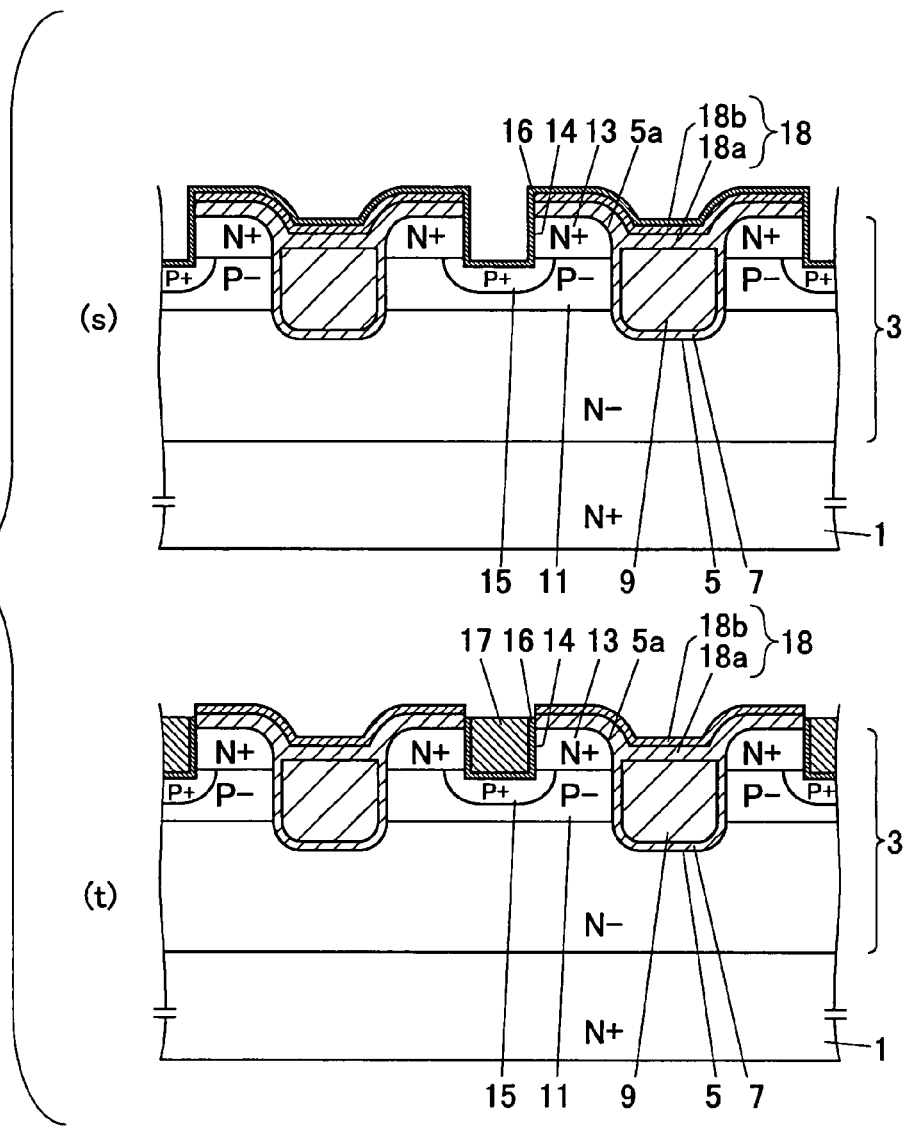
FIG. 15 is a cross-sectional view illustrating a subsequent step in the embodiment.

(a) In a step described with reference to FIG. 8-(a), which is the same as in the above-mentioned step (a), the silicon oxide film 35 having an opening for an area where a trench is to be formed is formed.

(b) The N-type epitaxial layer 3 is etched by an isotropic etching technique such as chemical dry etching while the silicon oxide film 35 is used as a mask and a concave portion 5b for a trench is formed.

(c) The N-type epitaxial layer 3 is etched by the anisotropic etching technique while the silicon oxide film 35 is used as a mask and the trench 5 is formed. In accordance with this, it is possible to form the trench 5 having a tapered shape at the shoulder portion 5a.

Thereafter, by performing the same steps from step (d) of the above-mentioned manufacturing method described with reference to FIGS. 4 and 8 to 15, a power MOSFET is formed. However, steps (d) and (e) are performed so as to round the corner of the trench 5.

Figure 19:
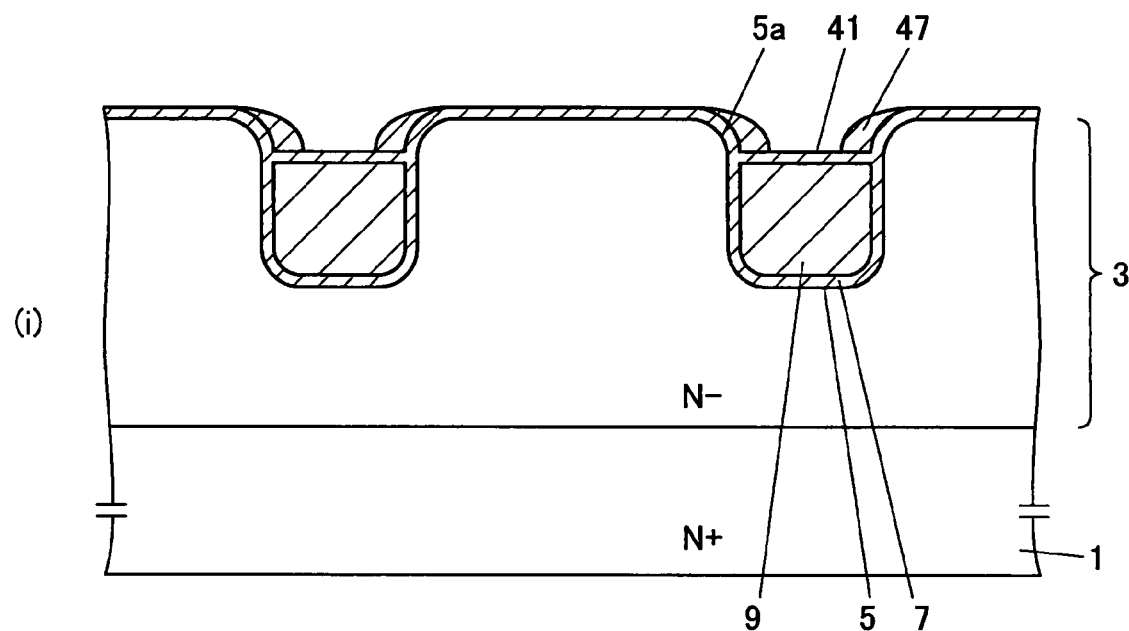
FIG. 19 is a cross-sectional view illustrating a part of a step in a manufacturing method according to another embodiment.

Further, in the above-mentioned step (i), as shown in FIG. 19, after the cap oxide film 41 is formed on the surface of the N-type epitaxial layer 3 and on the top surface of the gate electrode 9, a silicon oxide film may be deposited and the etchback process may be performed. As shown in FIG. 19, a step of forming a side wall 47 may be included.

In this manner, by forming the side wall 47 on a side of the shoulder portion 5a of the trench 5 before the P-type body diffusion layer 11 is formed in the above-mentioned step (j), it is possible to prevent boron ions from entering the gate electrode 9 from the shoulder portion 5a upon implanting the boron ions so as to form the P-type body diffusion layer 11 in the above-mentioned step (j). In accordance with this, it is possible to have a uniform distribution of impurity concentration in a depth direction of the gate electrode 9.

As mentioned above, the embodiments according to the present invention are described. However, the present invention is not limited to the above-mentioned embodiments. Size, shape, material, arrangement, conditions of the manufacturing steps, and the like are employed as an example and variations and modifications may be made without departing from the scope of the present invention.

For example, in the above-mentioned embodiments, the present invention is applied to an N-channel type power MOSFET. However, when a power MOSFET of an opposite conductivity type relative to the embodiments is prepared using a P-type semiconductor substrate, it is possible to apply the present invention to the P-channel type power MOSFET. When conductivity types of a silicon substrate and an epitaxially grown layer are different to each other, it is possible to apply the present invention to IGBT (insulated gate bipolar mode transistor).

Figure 20:
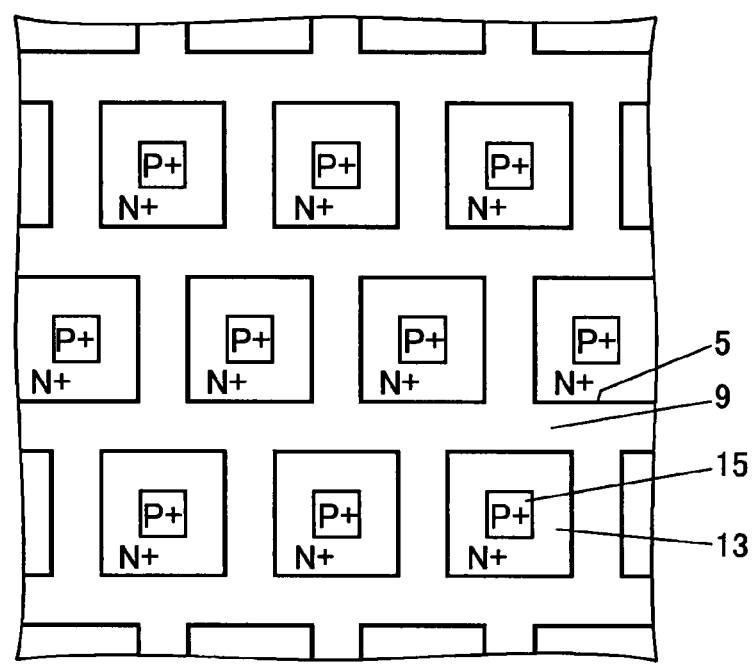
FIG. 20 is a plan view showing a cell portion of a semiconductor device according to another embodiment.

Further, arrangement of cells is not limited to the grid-like shape as shown in FIG. 5. The arrangement may be staggered as shown in FIG. 20 or may be a stripe structure. In the case of the strip structure, the source trench 14 may have a hole shape or a stripe shape. Moreover, a planer shape of the cells is not limited to a rectangular shape but may include a circular shape.

In the above-mentioned embodiments, only a single example is described for each insulating film. However, other types of insulating film may be used.

Various types of conductive materials may be used for the metallic materials such as the barrier metal 16, tungsten plug 17, source electrode film 19, metallic film 31 for the gate electrode, and the like.

The P-type body diffusion layer 11 and the N-type source diffusion layer 13 may be formed before the trench 5 is formed.

The hole of the connection hole 29 may have a stripe shape. A diameter or a stripe width of the connection hole 29 may be substantially the same as a width of the source trench, so that the tungsten plug may sufficiently remain. In this case, an effect of reduction of a chip area is obtained and flatness of the metallic film for the gate electrode is improved.

Although the silicone substrate 1 and the epitaxial layer 3 formed thereon are used as a semiconductor substrate, a silicon substrate and an impurity diffused layer formed on a surface thereof may be used as a semiconductor substrate. Further, a semiconductor substrate such as a SiC substrate may be used in addition to the silicon substrate.

Although the bottom of the trench 5 is U-shaped in the embodiments, the bottom may be rectangular or V-shaped.

The present invention is not limited to the specifically disclosed embodiment, and variations and modifications may be made without departing from the scope of the present invention.

The present application is based on Japanese priority application No. 2006-251621 filed Sep. 15, 2006, Japanese priority application No. 2006-318931 filed Nov. 27, 2006, the entire contents of which are hereby incorporated herein by reference.

What is claimed is:

1. A semiconductor device provided with a power MOSFET comprising:

a semiconductor substrate constituting a drain;

a trench formed on a surface of the semiconductor substrate;

a gate electrode in the trench, the gate electrode being made of polysilicon and formed via a gate insulating film;

a body diffusion layer on a surface side of the semiconductor substrate, the body diffusion layer being positioned adjacently to the trench and formed shallower than the trench;

a source diffusion layer on the surface of the semiconductor substrate, the source diffusion layer being positioned adjacently to the trench and the body diffusion layer and formed shallower than the body diffusion layer;

a first interlayer insulating film formed on the gate electrode; and a source electrode film made of a metallic material and formed on the semiconductor substrate including an area on the first interlayer insulating film, the source electrode film being insulated from the gate electrode and electrically connected to the body diffusion layer and the source diffusion layer, wherein a top surface of the gate electrode and a top surface of the first interlayer insulating film are formed in a recessed manner in the trench relative to the surface of the semiconductor substrate so that a film thickness of the source electrode film increases above the gate electrode, and a surface portion of the semiconductor substrate for the trench is formed into a tapered shape; wherein the first interlayer insulating film is disposed on the gate electrode and extended to cover a top surface portion of the semiconductor substrate for the trench and a concave portion is disposed an a surface of the first interlayer insulating film, and the metallic material is embedded in the concave portion.

2. The semiconductor device according to claim 1, wherein a portion of the polysilicon of the gate electrode is extended on the semiconductor substrate and a second interlayer insulating film is formed between the first interlayer insulating film and the source electrode film on the polysilicon extended on the semiconductor substrate.

3. The semiconductor device according to claim 1, wherein the first interlayer insulating film includes a silicon nitride film.

4. The semiconductor device according to claim 1, further comprising:
   a source trench formed above the body diffusion layer and deeper than the source diffusion layer.

5. The semiconductor device according to claim 4, further comprising:
   a contact diffusion layer formed on the body diffusion layer and surrounding a bottom of the source trench.

6. The semiconductor device according to claim 4, further comprising:
   a barrier metal formed on an inner wall of the source trench; and
   a plug of metallic material embedded in the source trench via the barrier metal.

7. The semiconductor device according to claim 1, wherein said first interlayer insulating film comprises a lower layer of SiO and an upper layer of SiN.

* * * * *